(12) United States Patent
Hoey et al.

(10) Patent No.: US 9,691,649 B2
(45) Date of Patent: *Jun. 27, 2017

(54) LINEAR VACUUM ROBOT WITH Z MOTION AND ARTICULATED ARM

(75) Inventors: Gee Sun Hoey, Fremont, CA (US);
Terry Bluck, Santa Clara, CA (US);
Hoang Huy Vu, San Jose, CA (US);
Jimin Ryu, Fremont, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 1164 days.

This patent is subject to a terminal disclaimer.

(21) Appl. No.: 13/286,186

(22) Filed: Oct. 31, 2011

(65) Prior Publication Data

US 2012/0076626 A1   Mar. 29, 2012

Related U.S. Application Data

(60) Division of application No. 12/875,414, filed on Sep. 3, 2010, now Pat. No. 8,419,341, which is a
(Continued)

(51) Int. Cl.
*H01L 21/67* (2006.01)
*H01L 21/677* (2006.01)

(52) U.S. Cl.
CPC ...... *H01L 21/677* (2013.01); *H01L 21/67173* (2013.01); *H01L 21/67184* (2013.01);
(Continued)

(58) Field of Classification Search
USPC ............ 118/719; 156/345.31, 345.32; 414/935–941
See application file for complete search history.

(56) References Cited

U.S. PATENT DOCUMENTS 4,624,617 A   11/1986   Belna
4,782,713 A   11/1988   Torii et al.
(Continued)

FOREIGN PATENT DOCUMENTS

JP   63-139844     6/1988
JP   04046781 A    2/1992
(Continued)

OTHER PUBLICATIONS

European Extended Search Report and Opinion in European Patent Application No. 07253711.1, dated Oct. 25, 2011.
(Continued)

*Primary Examiner* — Karla Moore
(74) *Attorney, Agent, or Firm* — Perman & Green, LLP; Colin C. Durham

(57) ABSTRACT

There is described apparatus and methods for transporting and processing substrates including wafers as to efficiently produce at reasonable costs improved throughput as compared to systems in use today. A linear transport chamber includes linear tracks and robot arms riding on the linear tracks to linearly transfer substrates along the sides of processing chambers for feeding substrates into a controlled atmosphere through a load lock and then along a transport chamber as a way of reaching processing chambers. A four-axis robot arm is disclosed, capable of linear translation, rotation and articulation, and z-motion.

20 Claims, 16 Drawing Sheets

Related U.S. Application Data continuation-in-part of application No. 11/523,101, filed on Sep. 19, 2006, now Pat. No. 7,901,539, and a continuation-in-part of application No. 12/325,993, filed on Dec. 1, 2008, now Pat. No. 8,293,066, and a continuation-in-part of application No. 12/368,241, filed on Feb. 9, 2009.

(60) Provisional application No. 61/259,928, filed on Nov. 10, 2009.

(52) U.S. Cl.
CPC .. *H01L 21/67196* (2013.01); *H01L 21/67201* (2013.01); *H01L 21/67742* (2013.01); *H01L 21/67745* (2013.01); *Y10T 74/20317* (2015.01); *Y10T 74/20323* (2015.01)

(56) References Cited

U.S. PATENT DOCUMENTS

| | | | |
|---|---|---|---|
| 4,819,167 A | 4/1989 | Cheng et al. | |
| 4,951,601 A | 8/1990 | Maydan et al. | |
| 5,076,205 A | 12/1991 | Vowles et al. | |
| 5,227,708 A | 7/1993 | Lowrance | |
| 5,293,107 A | 3/1994 | Akeel | |
| 5,584,647 A | 12/1996 | Uehara et al. | |
| 5,855,681 A | 1/1999 | Maydan et al. | |
| 6,053,687 A | 4/2000 | Kirkpatrick et al. | |
| 6,189,482 B1 | 2/2001 | Zhao et al. | |
| 6,248,176 B1 | 6/2001 | Yudovsky et al. | |
| 6,285,102 B1 | 9/2001 | Matsuoka et al. | |
| 6,318,951 B1 | 11/2001 | Schmidt et al. | |
| 6,367,410 B1 | 4/2002 | Leahey et al. | |
| 6,440,178 B2 | 8/2002 | Berner et al. | |
| 6,446,572 B1 | 9/2002 | Brcka | |
| 6,468,353 B1 | 10/2002 | Perlov et al. | |
| 6,593,718 B1 | 7/2003 | Yamazoe | |
| 6,672,820 B1 | 1/2004 | Hanson et al. | |
| 7,293,950 B2 | 11/2007 | Bonora et al. | |
| 7,737,035 B1 | 6/2010 | Lind et al. | |
| 7,841,820 B2 | 11/2010 | Bonora et al. | |
| 7,901,539 B2 | 3/2011 | Bluck et al. | |
| 7,905,960 B2 | 3/2011 | Choi et al. | |
| 8,419,341 B2 * | 4/2013 | Hoey | H01L 21/67173 118/719 |
| 2001/0024611 A1 | 9/2001 | Woodruff et al. | |
| 2004/0003828 A1 | 1/2004 | Jackson | |
| 2004/0069225 A1 | 4/2004 | Fairbarn et al. | |
| 2004/0151562 A1 | 8/2004 | Hofmeister et al. | |
| 2005/0005847 A1 | 1/2005 | Hiroki | |
| 2005/0014368 A1 | 1/2005 | Yoshioka et al. | |
| 2005/0087300 A1 | 4/2005 | Ishizawa et al. | |
| 2005/0120578 A1 | 6/2005 | Van Der Meulen | |
| 2005/0218507 A1 | 10/2005 | Kao et al. | |
| 2006/0045664 A1 | 3/2006 | Niewmierzycki et al. | |
| 2006/0073276 A1 | 4/2006 | Antonissen | |
| 2006/0102078 A1 | 5/2006 | Fairbairn et al. | |
| 2008/0066678 A1 | 3/2008 | Bluck et al. | |
| 2008/0073324 A1 | 3/2008 | Nogami et al. | |
| 2008/0308038 A1 | 12/2008 | Oh | |
| 2009/0078374 A1 | 3/2009 | Bluck et al. | |
| 2009/0191030 A1 | 7/2009 | Bluck et al. | |
| 2010/0329827 A1 | 12/2010 | Hoey et al. | |
| 2011/0158773 A1 | 6/2011 | Bluck et al. | |

FOREIGN PATENT DOCUMENTS

| | | |
|---|---|---|
| JP | 8119409 | 5/1996 |
| JP | 08119409 | 5/1996 |
| JP | 2000-216214 | 8/2000 |
| JP | 2000-294613 | 10/2000 |
| JP | 2002066976 A * | 3/2002 |
| JP | 2006066976 A * | 3/2006 |
| JP | 2008028179 | 2/2008 |
| JP | 2009071180 | 2/2009 |
| KR | 10-0281119 | 3/2001 |
| WO | 00/41855 | 7/2000 |
| WO | 03/038869 | 5/2003 |
| WO | 2004/010476 A2 | 1/2004 |

OTHER PUBLICATIONS

Office Action in U.S. Appl. No. 12/325,993, mailed Nov. 17, 2011.
Office Action in U.S. Appl. No. 12/368,241, mailed Nov. 16, 2011.
Office Action in U.S. Appl. No. 13/042,407, mailed Nov. 8, 2011.
Office Action in U.S. Appl. No. 12/875,414, mailed Nov. 17, 2011.
International Search Report and Written Opinion in International Application No. PCT/US11/39838, mailed Oct. 6, 2011.
Japanese Office Action in Japanese Application No. 2007-239922, mailed Jul. 5, 2011.
Korean Office Action (Final) in Korean Patent Application No. 2008-111278, dated Feb. 23, 2011.
Korean Office Action in Korean Patent Application No. 2008-111278, dated Sep. 20, 2010.
Chinese Office Action in Chinese Application No. 200710192971.0, dated Jun. 19, 2009.
European Supplementary Search Report and Opinion in European Patent Application No. 08253702.8, dated Mar. 31, 2009.
Malaysian Office Action in Malaysian Application No. PI20071548, dated Aug. 15, 2011.
Office Action in U.S. Appl. No. 11/523,101, mailed Jun. 21, 2010.
Office Action in U.S. Appl. No. 11/523,101, mailed Jan. 5, 2010.

* cited by examiner

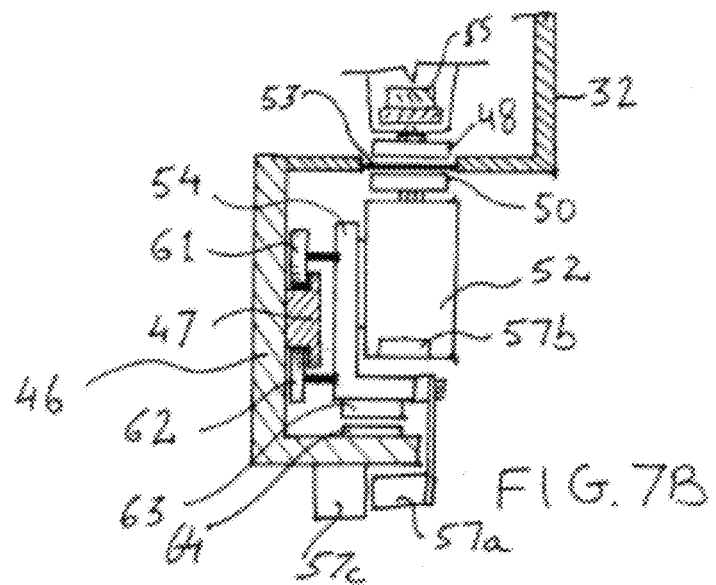
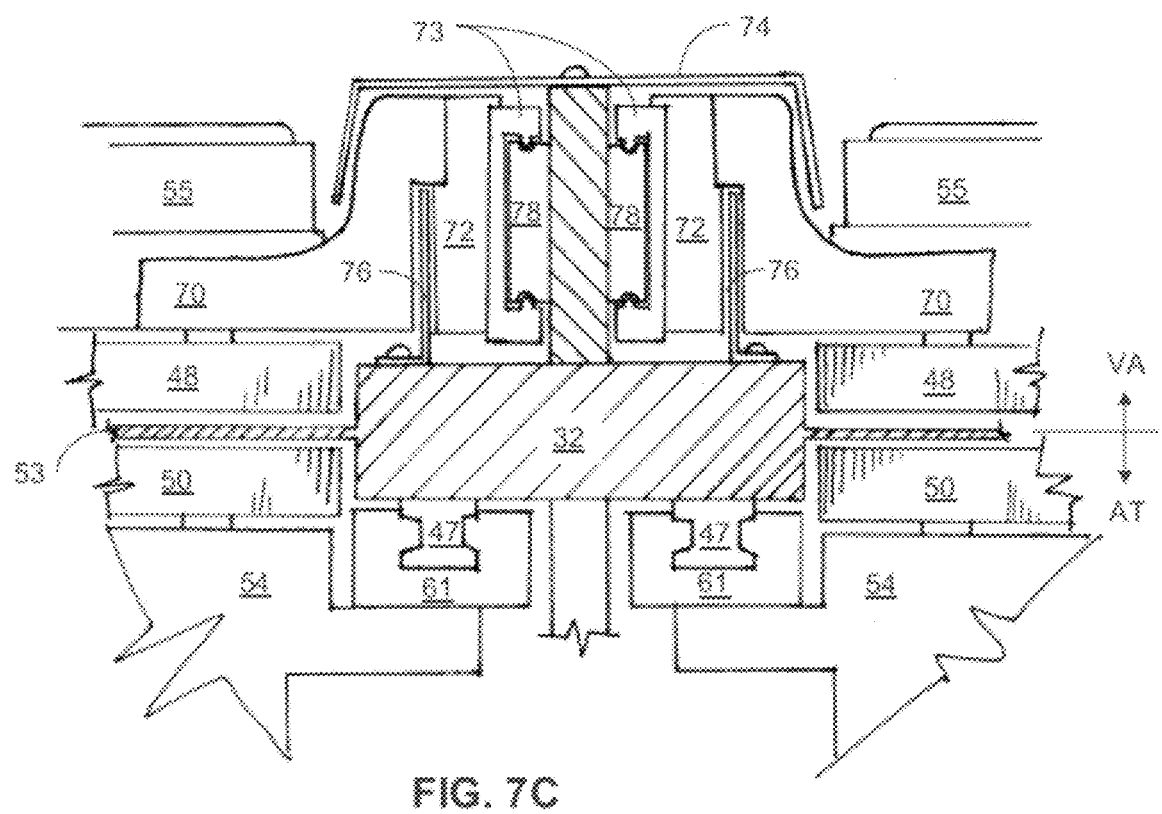

LINEAR VACUUM ROBOT WITH Z MOTION AND ARTICULATED ARM

RELATED APPLICATIONS

This application is a Divisional of U.S. application Ser. No. 12/875,414, filed Sep. 3, 2010 now U.S. Pat. No. 8,419,341, which is a Continuation-in-Part of U.S. application Ser. No. 11/523,101, filed Sep. 19, 2006 now U.S. Pat. No. 7,901,539, of U.S. application Ser. No. 12/325,993, filed Dec. 1, 2008 now U.S. Pat. No. 8,293,066, and of U.S. patent application Ser. No. 12/368,241, filed Feb. 9, 2009. This application also claims priority benefit from U.S. Provisional Application Ser. No. 61/259,928, filed Nov. 10, 2009. The disclosures of all which applications are incorporated herein by reference in their entirety.

FIELD OF THE INVENTION

This invention has to do with novel apparatus and methods for transporting and processing substrates in general and wafers in particular. More specifically, the invention relates to linear motion vacuum robots having z-motion and articulated arm.

BACKGROUND

In the manufacture of semiconductors, a common tool, referred to as a cluster tool, is one of the key units used in the manufacture of wafers. A typical commercial device has a generally polygonal central transport area with chambers attached along the circumference. The chambers extend outward around the central area. When wafers are processed, they are moved first from an input/output station on the circumference of the central chamber into the central transport chamber and then from the central transport chamber into an attached or circumferential processing chamber where processing is performed. In this tool, as in substantially most semiconductor and flat panel manufacturing systems used today, the practice is to process wafers one at a time. A wafer may be moved into a chamber for processing and then back to the central transport chamber. This can be followed by a further move to another circumferential processing chamber and then following processing, back to the central transport chamber. Eventually the wafer when fully processed is moved out of the tool altogether. The movement out goes again through an input/output station or chamber which in connection with vacuum systems is generally called a load lock where the wafer moves from vacuum to atmosphere. A unit of this sort is described for example in U.S. Pat. No. 4,951,601.

Another tool indexes wafers along a central axis and feeds wafers through surrounding processing chambers. In this tool, all wafers are fed simultaneously to the next processing stop. Wafers cannot move independently although they can be processed independently. They all remain at a process station for the same amount of time, but the processes at each station can be independently controlled, subject of course to the maximum time permitted at each station. Although the first described tool could be made to operate in this way, in fact however, it may move wafers so that they do not progress to the adjacent processing chamber in sequence and all are not required to have the same dwell time at a processing chamber.

When either of these systems is operating, the central area is generally at vacuum, but it may also be at some other preselected or predetermined and controlled environment. The central section, for example, can have a gas atmosphere that is useful to the processes being preformed in the process chambers. The chambers or compartments along the outer surface of the central zone are generally at a vacuum too, but may also have a pre-selected and controlled gaseous environment. Processing is also generally performed in a vacuum by moving wafers while in vacuum from the central chamber to an attached chamber or compartment. Generally, once the wafer reaches a chamber or compartment for processing, the chamber or compartment is sealed off from the central chamber. This prevents materials and/or gases used in the processing chamber or compartment from reaching the central zone, preventing contamination of the atmosphere in the central zone as well as attached processing chambers and/or preventing contamination of wafers located in the central zone waiting to be processed or further processed. This also permits the processing chamber to be set at a vacuum level different than that used in the central transport chamber for the particular processing to be carried out in the chamber. For example, if the processing technology of a chamber requires more of a vacuum, then with a seal in place between the central zone and the chamber, the chamber itself can be further pumped down to match the process requirements for the particular processes to be performed within that chamber. Alternatively, if less of a vacuum is required, the pressure may be increased without affecting the pressure of the central chamber. After processing of the wafer is completed, the wafer is moved back to the central chamber and then out of the system. In this way the wafer may progress through this tool sequentially through the chambers and all of the available processes. Alternatively the wafer may proceed through only one or selected chambers and be exposed to only selected processes.

Variations on these processes are also in use in equipment offered to the field. However, they all tend to rely on a central area or zone that is integral to the various processes. Also since the predominant usage of such equipment is to make wafers, the discussion will primarily be in terms of wafers. However, it should be understood that most of the processes under discussion are also applicable to substrates in general, e.g., flat panel display, solar panels, light emitting diodes, etc., and that the discussions should be taken to also apply to such substrates and such manufacturing equipment.

Recently there has been described a system that is distinct from these conventional units, in that it is linear in shape rather than polygonal, and wafers move for processing from one chamber to the next chamber. Since the wafer moves in sequence from one chamber to an adjacent chamber, there is no need for the central zone as part of the equipment. In this tool, a wafer enters the unit and is generally attached to a chuck that travels with the wafer as it moves through the system. In this unit, processing is performed for equal amounts of time in each chamber.

This system has a smaller footprint than is typical in this field since the footprint approximates the footprint of the processing chambers only and does not include a large central zone. This is an advantage of this type equipment. This system is described in a pending published patent application, Publication No. 2006/0102078 A1. This particular system has a uniform dwell time at each process station. This allows for some differences in processing limited of course by the length of the longest dwell period. If one requires independently controlled dwell times at the various stations, another approach may be preferred. Also this type of equipment has the disadvantage that if one station is down for repair or maintenance, then the whole system is itself unavailable for processing.

SUMMARY OF THE INVENTION

This invention is directed to a novel wafer processing unit intended to permit separately controlled dwell times at processing stations while maintaining a small footprint. It also allows ongoing operations even if one or more of the stations is down for one reason or another. In part this is in recognition that the cost of manufacturing semiconductors is extremely high and costs are increasing. The higher the costs, the greater the risks in undertaking investments in this field. An objective is to define equipment that lowers costs by a reasonable percentage and provides improved systems and services in accordance with "Lean" principles of manufacture. Thus an objective is to maximize processing chambers while maintaining a small footprint. Another objective is to maximize process station utilization. Another objective is to simplify robotics and the service of this equipment. The system will also offer considerable redundancy, including up to 100% availability of the system for processing even during mainframe servicing. In such an event, less chambers will be in use but all processes can continue to be available for treatment of wafers. Servicing or processing chambers will be possible from the back or front of the processing chambers. Additionally, in the preferred embodiment the processing chambers will be set up in a linear arrangement. This assures the smallest footprint for a system that permits individual programs for wafers at the various processing stations.

The processing chambers generally may have the capability of performing any of the various processes one uses in connection with processing wafers. For example in the manufacture of a wafer, the wafer would normally be carried through one or more etching steps, one or more sputtering or physical vapor deposition processes, ion implantation, chemical vapor deposition (CVD) and heating and/or cooling processes, among others. The number of processing steps to make a wafer could mean that multiple tools or tools with large subsystems would have been required if using prior art devices to perform these various processes. The instant system; however, offers the further advantage that additional functional stations can be added without a significant increase in size or without the need to add new total systems.

To achieve these various objectives, transport of wafers is structured to be independent of chamber design. Thus the chambers are designed to perform as a chamber with certain processing capabilities and the transport system is structured to operate independently of chamber design and is structured to feed wafers to and from processing chambers. Transport in the disclosed embodiment is dependent on a simple linkage arm based on linear and rotary motion coupled through a vacuum wall. In line with maintaining costs low, the chamber design is based on modularity. Thus, in one embodiment, the system may have 3 chambers or a matching structure can be utilized and the system can have 6 chambers. Alliteratively this last sentence can be repeated with 4 and 8 chambers as well as with other multiples, or modules may be matched that have a different number of processing stations.

The system is expandable and in addition it is expandable independently of technology that might be applied as future processes or applications. A linear wafer transport is used. This results in high throughput in a system of small footprint that is not over demanding of space in clean rooms. In addition different process steps can be structured into the same treatment platform.

According to an aspect of the invention, a substrate processing system is disclose, comprising an elongated substrate transfer chamber having an evacuated section and an atmospheric section; a first linear track affixed to the transfer chamber within the evacuated section; a second linear track affixed to the transfer chamber at the atmospheric section; a first base linearly riding on the first linear track; a second base linearly riding on the second linear track; a speed reducer mounted onto the first base and having a magnetically-coupled follower as its input and providing a lower rotational speed at its output; a rotary motor mounted onto the second base and rotating a magnetic driver, the magnetic driver imparting a rotational motion to the magnetically-coupled follower across a vacuum partition; and, a robot arm coupled to the output of the speed reducer; a z-motion module having a magnetically-coupled follower as its input is affixed to the first base; a second rotary motor is affixed to the second base and imparts rotary motion to the z-motion follower to thereby impart z-motion to the robot arm. A linear motor may be affixed to the second base to impart linear motion, and magnetized wheels may be coupled to the second base. A linear motion encoder may be coupled to the second base and a rotary encoder may be coupled to the rotary motor. In a system having two robot arms, an arm extension may be coupled to one of the robot arm so as to enable the axis of rotation of the robot arms to coincide.

According to another aspect of the invention, a method for transferring wafers from a loadlock to a processing chamber via an evacuated transfer chamber is provided, comprising: providing a robot arm within the transfer chamber; magnetically coupling linear motion to the robot arm across a vacuum partition to thereby linearly transport the robot arm; magnetically coupling rotational motion across a vacuum partition to rotate the robot arm, while reducing the speed of the rotational motion within the evacuated transfer chamber; magnetically coupling rotational motion across a vacuum partition to elevate the robot arm.

According to aspects of the invention, a robot arm having four-axis motion (linear, rotation, extension, Z-lift) is enabled without having any wires or motors in the vacuum environment wherein the robot arm operates. All of the motors and electronics required for the various motions are situated outside of the vacuum chamber, while all of the motive forces required for the robot arm's four-axis motion are coupled across a wall of the vacuum chamber.

BRIEF DESCRIPTION OF THE DRAWINGS

FIG. 7B is a sectional view about line A-A of FIG. 4, illustrating another embodiment of the linear motion assembly.

FIG. 7C is a sectional view illustrating an example of a linear track in atmosphere and linear track in vacuum.

DETAILED DESCRIPTION OF THE INVENTION

Figure 1:
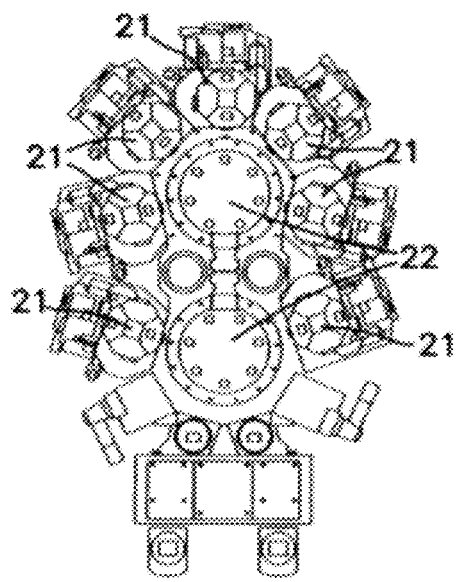
FIG. 1 is a schematic illustration of a prior art cluster tool intended for PVD applications.

Referring now to FIG. 1, there is illustrated a cluster tool of the type commonly in use today. In general this comprises processing chambers 21 radially disposed around and attached to central chambers 22. In this system, there are two central chambers. Other systems may have only a single central chamber. A system with more than two can exist except that it is cumbersome and instead users will generally acquire another system. In operation, a robot is typically located within each central chamber 22. The robot receives wafers into the system and carries wafers from the central chamber to processing chambers and after processing back to the central chamber. In some prior art systems, a central robot can access only a single wafer and single chamber at one time. Thus the robot can become engaged or busy during processing in connection while a wafer is in a single chamber. This combination of a single robot tied to a processing station during processing is a limitation on the throughput of this type of cluster tool. More modern units use robotics that are multi-armed. The processing chambers may comprise any form of processor and may comprise for example a chamber for physical vapor deposition, a chamber for chemical vapor deposition (CVD) or for etch or for other processes that may be performed on a wafer during its manufacture. This type tool permits processing for different periods of time since the transfer by the robotic arm into the chamber and its removal from the chamber when the wafer is processed is independent of other factors and is computer controlled. Obviously processing can be set for the same time and for a defined sequence.

Figure 2:
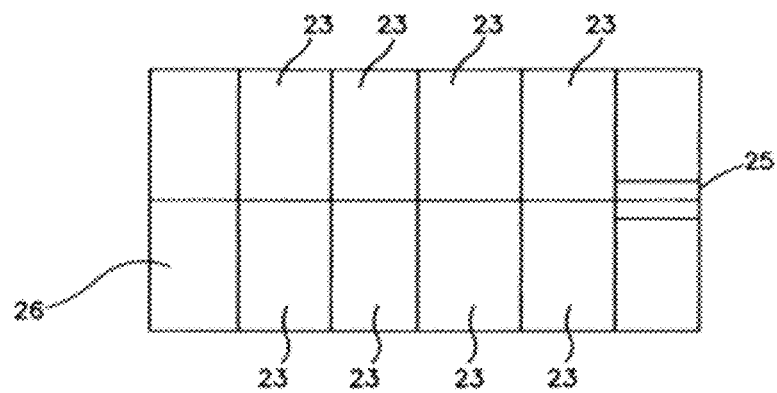
FIG. 2 is a schematic illustration of the system described in the aforementioned patent publication (2006/0102078 A1) and is in the nature of a prior art system.

Referring now to FIG. 2, there is illustrated a tool for processing wafers in which the dwell time of the wafer within a chamber is the same for each chamber. In this embodiment the processors 23 are lined up linearly and in this instance chambers are positioned adjacent to each other and also on top of one another. At the end there is an elevator 25 that moves the wafer being processed from one level to the other. At the entrance 26 a wafer enters and is positioned on a support where it remains as it moves through the system. In an embodiment of this system, the support raises the wafer to the upper level of processors and the wafer then moves in sequence one after the other through the process chambers 23 at that level. The elevator 25 changes the level of the wafer and it then moves along the other level, again from one process chamber through it and then through the next chamber and so on, and then out of the system.

Figure 3:
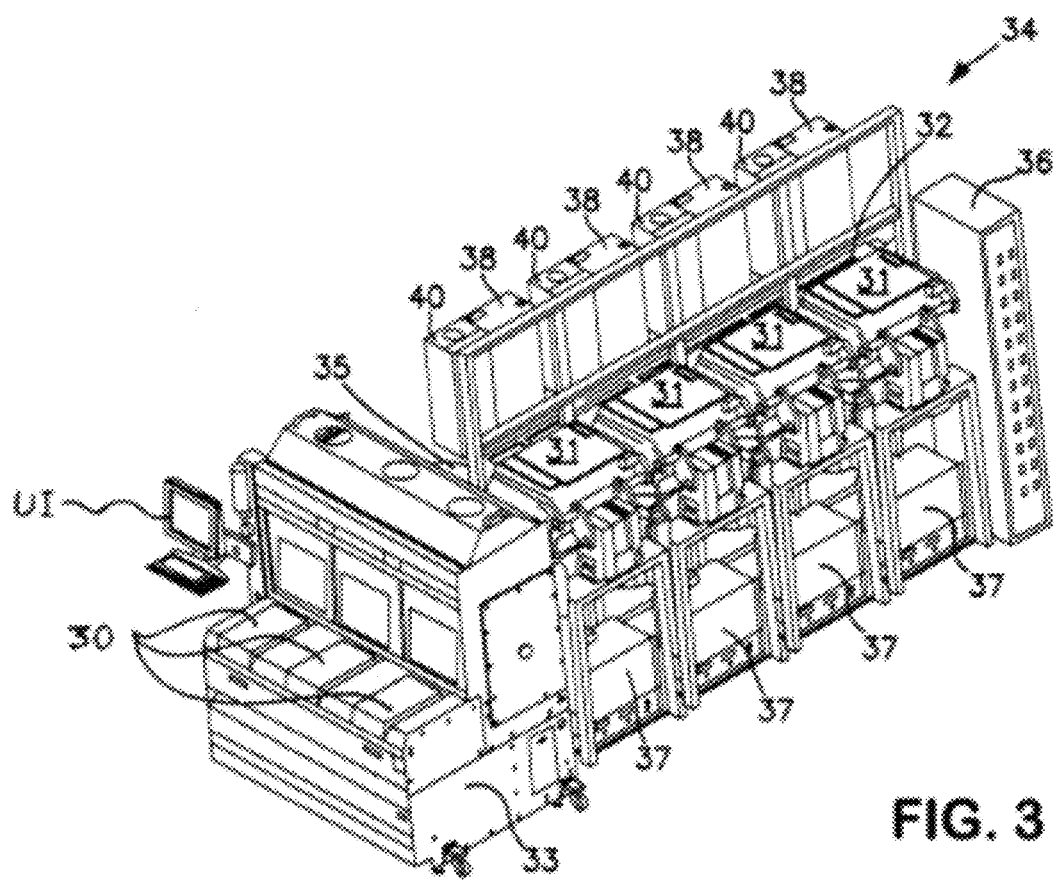
FIG. 3 is a schematic illustration of a processing system in accordance with this invention.

Referring now to FIG. 3, processing chambers 31 are located linearly along transport chamber 32. Wafers enter system 34 via EFEM (Equipment Front End Module) 33 or some equivalent feeding device. EFEM 33 comprises stations 30 upon which FOUP (from front opening unified pod) may be situated. The FOUPs (not shown) comprise a housing or enclosure where wafers are housed and kept clean while waiting to enter the processing operations. Associated with the EFEM 33 may also be a feeding mechanism to place wafers into the system for processing and to remove wafers from the system to be temporarily stored after processing. A FOUP of wafers is placed onto the EFEM where wafers are then transferred one by one from the FOUP by a blade that lifts the wafer from the FOUP within EFEM 33 and carries the wafer into load lock compartment 35 thus entering the system. From load lock compartment 35 wafers travel along transport chamber 32 from which they transfer into processing chambers 31. After a substrate enters a processing chamber, the substrate leaves the support arm and rests instead on a substrate support within the chamber. At this point a valve is closed to separate the atmosphere of the processing chamber from the atmosphere of the transport chamber. This permits changes to be made within the processing chamber without contaminating the transport chamber or other processing chambers. After processing the valve separating the processing chamber from the transport chamber opens and the wafer is removed from the processing chamber and transferred along transport chamber 32 to another processing chamber for additional processing or to the load lock from which the wafer is returned to FOUP on EFEM 33. In this Figure there are shown 4 processing chambers 31. There is also shown 4 process power supplies 37 and a power distribution unit 36. These in combination provide the electronics for the system and the power to each individual process chamber. Above the process chambers 31 are process gas cabinets 38 and information processing cabinets 40. It is through these units that information keyed into the system control movements of the substrates along transport chamber 32 and whether or not the substrate is transferred into a processing chamber for further processing. These units also provide records of what has occurred within the processing chambers. Gases are provided for use within the chambers during processing. Although the robotic handling mechanism to feed wafers into the system and through the processing stations in the system is described as a two arm system, in fact more than two arms may be present and each can be set to move independently or together within the transport travel chamber.

The processing chambers in a system may perform different processes as desired in the manufacture of wafers. Many manufacturers today buy dedicated systems in which the entire system is given over to sputter or etch processes. In essence there are sufficient sputter steps or etch steps in the manufacture of a wafer that a four or more stage system can be entirely devoted to sputtering operations. Alternatively, a wafer can be carried through a series of operations, each different yet each required in leading to a final process. For example, in a five process station, one could reasonably expect the following sequence in use. At the first process station the wafer will be subjected to a degas operation; the second station could be a precleaning station; the third a sputtering station to deposit titanium for example; the fourth a sputter station to deposit nickel vanadium for example; and, at the fifth station the sputter deposition of gold could occur.

Figure 4:
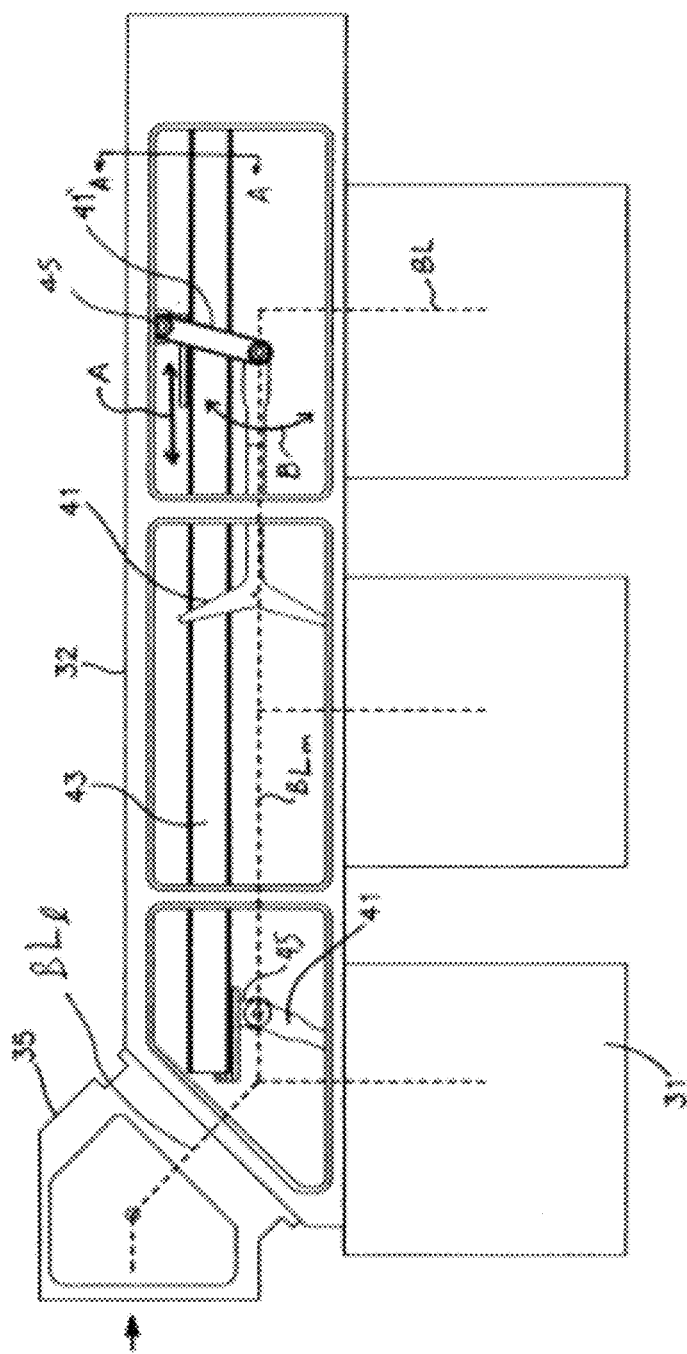
FIG. 4 is a top schematic view for purposes of more clearly illustrating the transfer chamber. In this Figure this has been done in a three process station structure but this number of stations has been used only for illustrative purposes.

Referring now FIG. 4 there is illustrated a three station system with top covers removed. An objective in connection with this Figure is to provide more of an understanding of the transport chamber 32. A wafer to be processed enters this system at load lock 35. Load lock 35 is a dual level load lock and can hold and process two wafers simultaneously. One is on a lower lever and the other on an upper level. At the load lock wafers entering the system enter into the vacuum or controlled environment. Also wafers that have been processed pass through load lock 35 during their travels leaving this system and the vacuum or other controlled conditions within the system and return into the FOUP (not shown in this Figure). Once a wafer completes its transition from non-vacuum conditions to vacuum conditions, the wafer is lifted onto an arm 41 which moves into transport chamber 32. One such arm is visible while the other is partially covered by elements in the first processing chamber at the left. The visible arm is shown delivering a wafer into this processing chamber 31 (or alternatively removing a wafer that has been processed from this chamber). Arms 41 move along within the transport chamber on a linear rail 43. In this embodiment the rails within the transport chamber 32 hold the support arms 41 above the floor of chamber 32. Also, the driving mechanism, which is not seen in this Figure, acts from outside the vacuum through the walls of the enclosure of chamber 32. It provides a generally linear movement to arms 41 as well as a rotary movement when it is desired to extend an arm into a chamber or into load lock 35. Thus the arms are used to move a wafer into or out of the transport chamber 32, into or out of a processing chamber 31 or into and out of load lock chamber 35. By avoiding contact with the base of this chamber less particles are produced as to maintain the environment in a purer or particle free condition. Additional details of this transport system will be shown and discussed in connection with figures that follow. Also although two arms are illustrated in this figure, it should be readily apparent that a system can have more or less than two arms on a rail and can handle more than two wafer transport devices at any one time.

According to a method of the subject invention, the support arms 41 are operated using a combination of rotary and linear motion in a manner such that the wafer is moved in straight lines only. That is, as shown in FIG. 4, arm 41 is moved using a combination of linear motion, exemplified by double-head arrow A, and a rotary motion, exemplified by double-head arrow B. However, the motion is programmed so that the center of the wafer follows straight lines motion, as shown by broken-lines BL1, BLm and BL. This enables making every opening of chambers 31 and load lock 35 only slightly larger than the diameter of the chamber. This also enables attaching any type and any combination of chambers onto transport chamber 32, as the combined linear-arcuate motion of the arms 41 is actuated by a controller that can be programmed, e.g., via user interface UI (FIG. 3) to any situation.

According to a method of the invention, the following process is implemented to calculate the combined linear-arcuate arms' motion executed by the controller. The location of the center of a wafer as it is located in the loadlock is determined. The center of a wafer as it is located inside each of the attached processing chambers is determined. The pivotal point of each arm is determined (note that as discussed below, in some embodiments the pivotal points of both arms may be made to coincide). The order of transport is determined, i.e., whether each wafer needs to move between the loadlock and only one or more chambers. These values can be programmed into the controller using the UI. Then, the linear and rotational motion of each arm is calculated such that a wafer positioned on each arm would move in only straight lines between the determined pivotal point and the center determined for the loadlock and the chambers.

Figure 5:
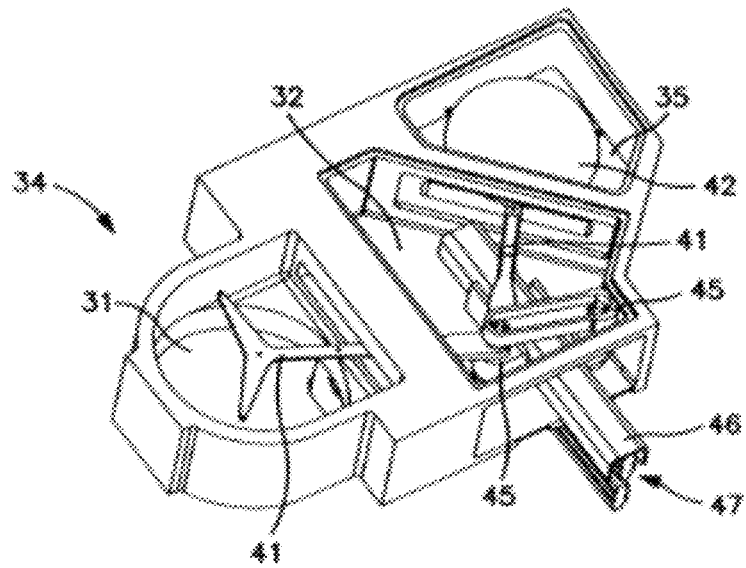
FIG. 5 is a schematic view of a segment of the system from the load lock and into the transport or transfer chamber.

Partly in order to simplify the combined linear-arcuate motion of the arms 41, the following feature of the invention is implemented in one embodiment. In FIG. 4, one of the support arms 41, specifically the arm 41 that is fully exposed in FIG. 4, is coupled to an arm extension 41', while the other arm 41 is coupled directly to the internal drive and support mechanism 45 (see also FIGS. 5 and 6). In the embodiment illustrated, the arm extension 41' is fixed, i.e., it only follows the linear motion of the drive and support mechanism 45, but it cannot be rotated. Rather, rotational motion is only imparted to the arm 41 affixed to the end of the arm extension 41'. Also, in the embodiment illustrated, the arm extension 41' is affixed such that the center of rotation or pivotal point of both arms 41 may be made to coincide, i.e., as shown the straight broken line BLm passes through the center of rotation or pivotal point of both arms 41. Moreover, as shown in the embodiment of FIG. 5, the arms 41 may be moved in linear direction such that the center of rotation of both arms 41 exactly coincides one above the other. Such a design allows fabricating the two arms 41 to be identical, as they will follow the same combined linear-arcuate motion from the same pivotal point centerline.

Referring now to FIG. 5, this figure shows portions of system 34, without covers closing off the internal elements, starting at load lock 35, continuing into the beginning of transport chamber 32 and including a first processing chamber 31. Illustrated in this figure a wafer 42 in load lock 35 rests on arm 41. Another arm 41 is shown extended into process chamber 31. As shown the arms, which act independently and may be at different levels, can be extended into different areas at the same time. The arms move wafers along transport chamber 32 into the system from the load lock and then about the system from processing chamber to processing chamber. Eventually the arms move the wafers after processing along the transport chamber and into load lock 35 and then out of system 34. When processing is completed, the wafer may then pass back into the FOUP from the load lock where processed wafers are collected. A wafer in the load lock or in process chambers is transferred by being lifted on a support surface associated with arm 41. Lift pins at the support surface raise the wafer to allow the arm access below the wafer permitting the arm to lift the wafer and move the wafer for next steps in the system. Alternatively, a structure in the nature of a shelf to slide under the wafer and support the wafer during transport may be employed to support and hold the wafer and to accept and release wafers from arms 41 when brought or taken from a chamber or compartment. The arms are positioned to pass above and below each other without contact and can pass by each other. They are connected to an internal drive and support mechanism 45. Drive and support mechanism 45 is provided with a linear drive track along which drive and support mechanism travels within transport chamber 32. Movement of drive and support mechanism 45 is brought about by an external driver such as a motor. One form of drive causes drive and support mechanism 45 to move linearly along drive track 46. Another cause's rotation of arms 41 to extend them from the transport chamber 32 into load lock 35 or process chambers 31 in the course of moving a wafer 42 into and through the system. Within drive track 46 are individual rails 47 (rails 47 are more clearly shown in FIG. 6) on which each drive and support mechanism independently rides enabling positioning so that each arm 41 moves and acts independently of the other. Movement of the wafer into a process chamber is in the nature of translating from its linear drive path into the chamber. This occurs because the wafer is undergoing two forms of motion simultaneously in the preferred embodiment. It is being moved linearly and rotated at the same time. The use of external motors or other forms of drive mechanism to drive this mechanism within the vacuum of transport chamber 32 reduces unwanted particles within the enclosed vacuum area.

Figure 6:
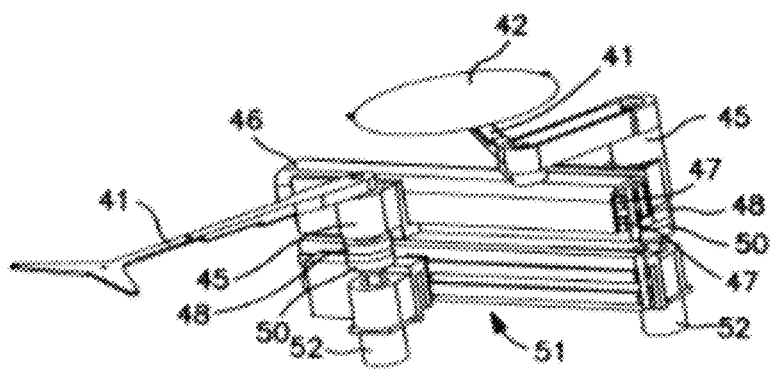
FIG. 6 is a schematic illustration of the wafer moving mechanism shown outside the encasement for the system.

Referring now to FIG. 6, there is illustrated the driving system employed in the preferred embodiment of this invention. In this figure, rails 47 of drive track 46 are each independently viewable. There is also shown a wafer 42 on one of the support arms 41. The other support arm is simply shown extended in this figure. Drive and support mechanism 45, each ride on one of rails 47. This facilitates the positioning of the arms 41 at different levels. Positioned at the base of each of the drive and support mechanism 45 is a magnetic head or magnetically-coupled follower 48. Positioned spaced from magnetic head 48 is a magnetic driver 50. Magnetic heads 48 are positioned within the vacuum of the transport chamber and a wall of the vacuum chamber (shown as 53 in FIG. 7) passes beneath each of the magnetic heads 48 and between the magnetic heads 48 and drivers 50. Thus drivers 50 are outside the vacuum wall of transport chamber 32. As has been discussed, arms 41 move wafers 42 into and through the processing system and arms 41 move independently of one another. These arms 41 are driven by a magnetic coupler arrangement comprising driver 50 and magnetic head 48. The coupler imparts both linear and rotary motion to arms 41. Driver 50 rides on outer rails 51 which are located outside the vacuum and appear on both sides of the rail system. One set is seen in a facing relationship while another exact rail appears on the opposite side. Rotation of the arm is transferred through the magnetic couplers and is driven by rotary motors 52. Although magnetic coupling is illustrated as used for linear movement and for rotation in this figure, it should be readily apparent that separate magnetic couplers and drivers may be used. Thus, although it is preferred to transfer linear and rotational movement through the same couplers, it is also possible to use separate couplers for linear movement and another set for rotational motion.

One type of arm that may be used to move and manipulate the wafers through transport chamber 32 including stops at the process stations 31 is described as a selective compliant articulated assembly robotic arm, referred to in a shorthand way as a SCARA robot. A SCARA system tends to be faster and cleaner than the Cartesian system it would likely replace.

Also in order to reduce and/or eliminate load factors in connection with the magnetic drive system, one can include repulsing magnets that will reduce the attractive forces created by the motion coupling magnets. The magnets that couple the rotary and linear motion into the vacuum have a significant amount of attractive force. This loads the mechanical mechanism that supports the parts. High loads mean lower bearing life and more particle generation. By using magnets located in the magnetic couplers or in a separate arrangement that repulse each other the attractive force can be reduced. In fact, inside the magnetic coupler the inner most magnets are not significant in achieving coupling stiffness. These inner magnets can however, be used to create a repulsive force with the coupling magnets used in attraction disposed in alternating N-S positions around the diameter of the coupler.

It should be understood of course that if one is not concerned about particle dust within the enclosed chambers, then drive mechanism may be included within the enclosed chambers.

Figure 7:
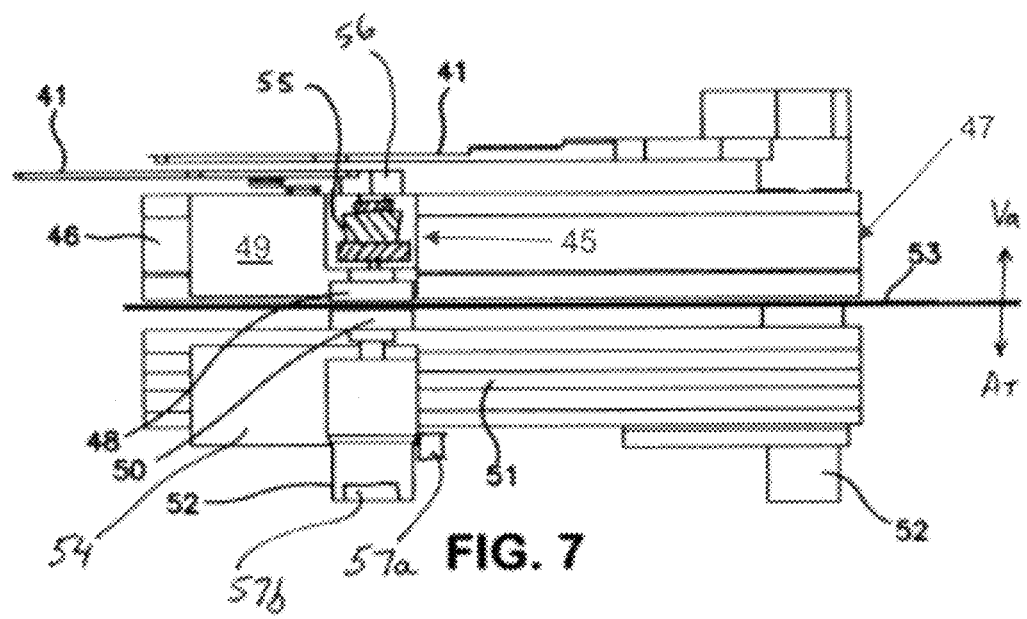
FIG. 7 is a schematic illustration of the track and drive system employed in the preferred embodiment.

Referring now to FIG. 7, there is shown a side view, without cover, of the track and drive system. In this figure, the vacuum wall or vacuum partition 53 is illustrated in its position between magnetic couplers 48 and 50 that drive and control the position of arms 41. Drive track 46 encloses rails 47 which provide linear motion imparted by outer rails 51 to drive and support mechanism 45 and thus to arms 41. Rotational motion is imparted by rotary motors 52. In FIG. 7, the side marked Va is in vacuum, while the side marked At is in atmosphere. As shown in FIG. 7, magnetic coupler 50 is driven by rotary motor 52, and causes coupler 48 to follow the same rotational motion due to magnetic coupling across vacuum partition 53. However, due to hysteresis in the magnetic coupling, the accuracy of the rotational motion of the arm may be degraded. In fact, due to the length of the arm, a small angular error in the couplers 48-50 may lead to a large displacement of the wafer that sits at the end of the arm 41. Also, due to the length and weight of the arm, and changes in weight depending on whether the arm supports a wafer or not, transient motions may persist for an unacceptable length of time. To avoid these problems, a reducing gear (sometimes referred to as speed reducer or gear reducer) 55 is interposed between the coupler 48 and the rotation coupler 56 or arm 41. The speed reducer is for reducing the motion speed imparted onto the robot arm by the motive force. The gear reducer 55 has its input the rotation of the magnetic coupler 48, and provides an output at a slower rotational speed so as to actuate the arm 41 at a rotational speed that is lower than the rotational speed of motor 52. In this particular example, the gear reducer is set to a reducing ratio of 50:1. This drastically increases the accuracy of the angular placement of the arm 41, reduces transient motion, and reduces the moment of inertia of the art on the drive assembly.

In FIG. 7 the reducing gear assembly 55 is mounted onto base 49. Base 49 is unmotorized and rides freely on linear rails 47. On the other hand, rotary motor 52 is mounted onto base 54, which rides on linear rails 51 using mechanized motive power. As the mechanized motive power linearly moves base 54, the magnetic coupling between the magnetic coupler 50 and magnetic follower 48 imparts the linear motion to the free riding base 49, thereby linearly moving the arm 41. Consequently, this arrangement is advantageous in that all of the motorized motions, i.e., linear and rotational, are performed in atmospheric conditions, while no motorized system resides inside the vacuum environment. Various embodiments for the motorized motion in atmosphere and the free-unmotorized motion in vacuum are described below as examples.

Figure 7A:
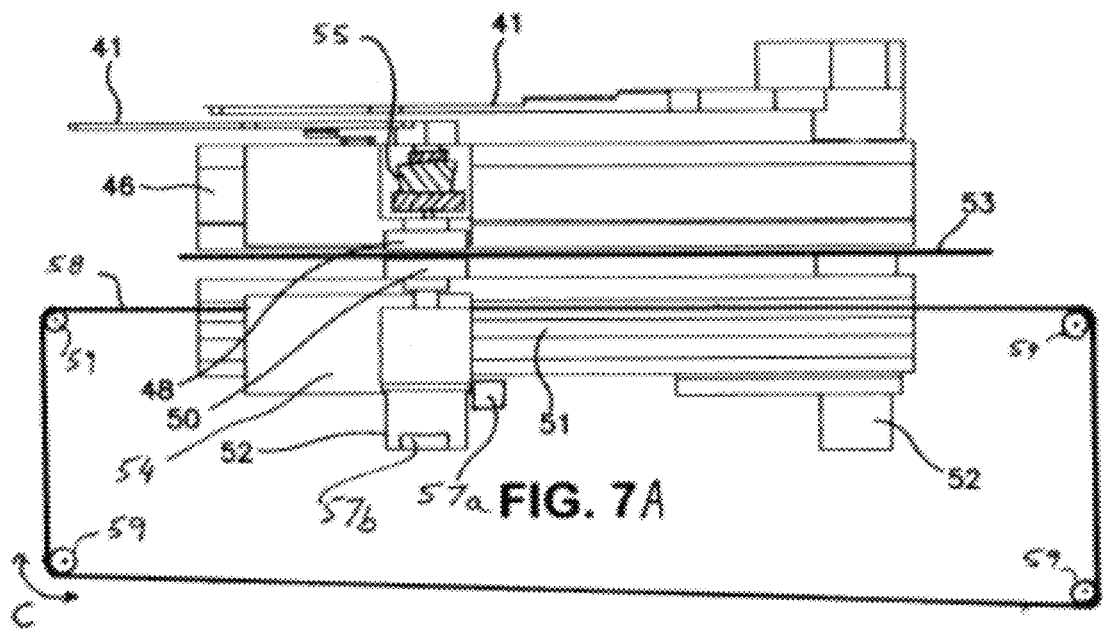
FIG. 7A illustrate an example of a linear motion assembly.

FIG. 7A illustrates an example of linear motion assembly. In FIG. 7A, a belt or chain drive is coupled to a base 54. The belt or chain 58 rides on rotators 59, one of which is motorized so as to impart motion in either direction, as illustrated by arrow C. To control the linear motion, an encoder 57*a* sends signals to a controller identifying the linear motion of base 54. For example, the encoder 57*a* may be an optical encoder reading encoding provided on linear track 46. Additionally, a rotary encoder 47*b* is provided on motor 52 and also sends encoding of the rotational motion to the controller. These readings of rotary and linear motion may be used to control the rotational and linear motion of the arms 41, such that the centerline of the wafer is moved only in straight lines.

FIG. 7B is a sectional view about line A-A of FIG. 4, illustrating another embodiment of the linear motion assembly. In FIG. 7C, drive track 46 supports rails 47, upon which wheels 61 and 62 ride. These wheels may be magnetized to provide improved traction. The wheels 61, 62 are coupled to the base 54, upon which the rotary motor 52 is mounted. A linear motor 63 is mounted to the lower part of the base 54 and interacts with an array of magnets 64 that are mounted onto the drive track 46. The linear motor 63 interacts with magnets 64 to impart a linear motive force to move the base 54 in the direction in and out of the page. The linear motion of the base 54 is monitored and reported by encoder 57*b*, which reads position/motion encoding 57*c* provided on the track 46. In this specific example, the encoder 57*b* has a precision of five-thousands of an inch.

FIG. 7C is a sectional view illustrating an example of a linear track in atmosphere and linear track in vacuum. The vacuum side is indicated by VA, while the atmospheric side is marked by AT, and vacuum partition 53 together with the chamber wall 32, separates between the two sides. In the atmospheric side, riders 61 ride on linear tracks 47. Since this side is in atmosphere, particle generation is not as important as in the vacuum side. Therefore, riders 61 may include wheels or may simply be made of sliding material, such as teflon. The base 54 attaches to the sliders 61 and supports the rotary motor that rotates the magnetic coupler 50. On the vacuum side, linear tracks 78 are made to accept sliding bearings 73, which are attached to base 70 via coupler 72. These may be made of stainless steel and should be fabricated to minimize particle generation. Additionally, covers 74 and 76 are provided in order to keep any particles generated within the confines of the bearing assembly. The base 70 extends beyond the bearing assembly and supports the gear reducer 55, which is coupled to the magnetic follower 48.

Figure 7D:
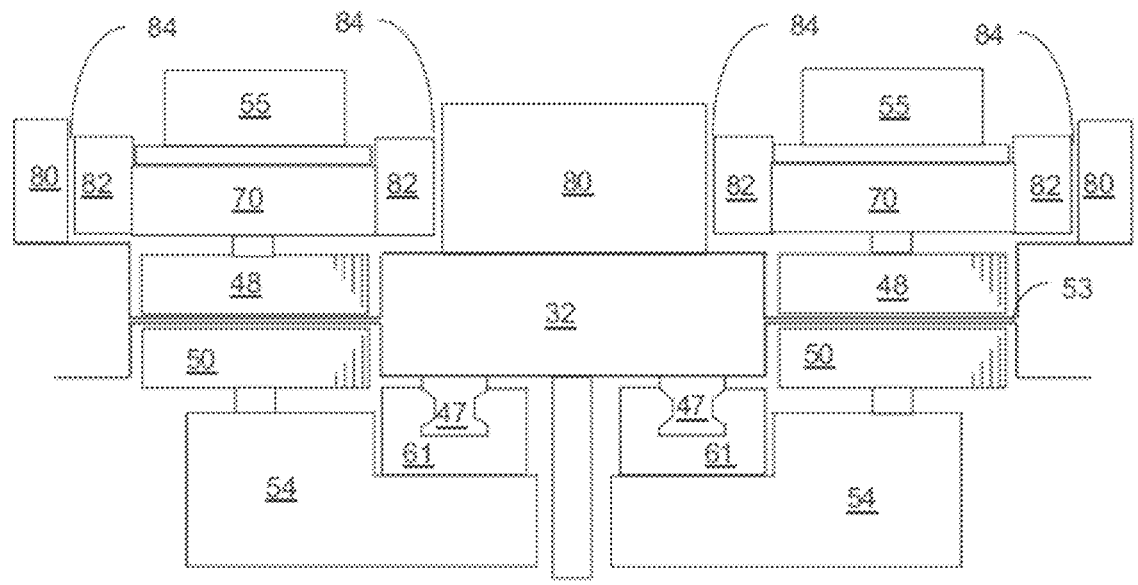
FIG. 7D illustrates another example of a linear track in atmosphere and linear track in vacuum.

FIG. 7D illustrates another example of a linear track in atmosphere and linear track in vacuum. In FIG. 7D the atmospheric side may be constructed the same as that of FIG. 7C. However, in order to minimize contamination, in the vacuum side magnetic levitation is utilized instead of slider bearings. As illustrated in FIG. 7D, active electromagnetic assemblies 80 cooperate with permanent magnets 82 to form magnetic levitation and allow free linear movement of base 70. Notably, the permanent magnets 82 maintain free space 84 and do not contact electromagnet assemblies 80. As base 54 moves linearly with sliders 61, magnetic coupling between coupler 50 and follower 48 impart the linear motion to the levitated base 70. Similarly, rotation of the coupler 50 causes rotation of the follower 48, which transmits the rotation to gear reducer 55. Therefore, it should be understood that references to "linear track" in this specification includes to tracks having mechanical motion or magnetically levitated motion.

Figure 8:
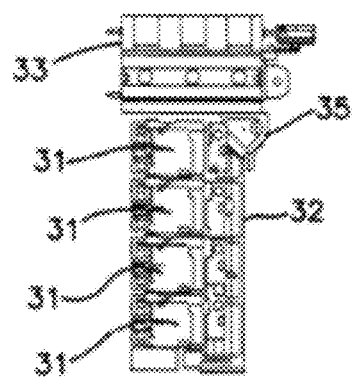
FIG. 8 is a schematic illustration of a 4-station physical vapor deposition (PVD) or sputtering system in accordance with this invention.

Referring now to FIG. 8 there is illustrated a processing system in accordance with this invention. As in the case of FIG. 3, EFEM 33 receives and stores wafers for presentation to system 34 including process chambers 31, which in this embodiment are intended to illustrate chambers in which sputter deposition occurs, by transferring the wafers first to load lock 35 and then along transport or transfer chamber 32. Processed wafers are then fed back along transfer chamber 32 to load lock 35 and then out of the system to EFEM 33.

Figure 9:
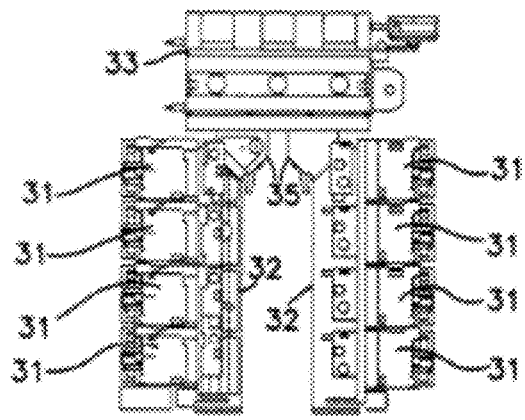
FIG. 9 is a schematic illustration of an 8-station system in accordance with this invention.
Figure 10:
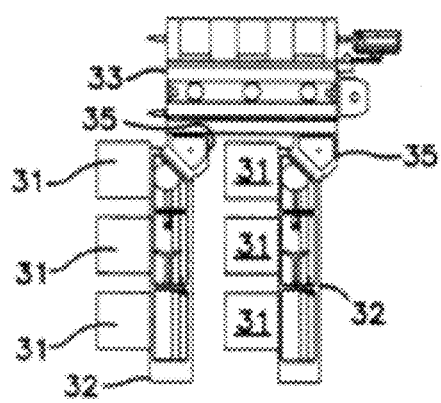
FIG. 10 is a schematic illustration of a 6-chamber system in accordance with this invention.

Referring now to FIG. 9 there is illustrated an eight station processing system in accordance with this invention. EFEM 33 feeds wafers to load locks 35. Wafers are then moved along transport chambers 32 and from transport chambers 32 into processing chambers 31. In this figure both sets of transport chambers are positioned in the central area and the process chambers 31 are on the outer sides. In FIG. 10 the processing sections are all lined up so that one set of processing chambers is a duplicate of the next set. Thus the processing chambers of the system appear lined up in parallel.

Figure 11A:
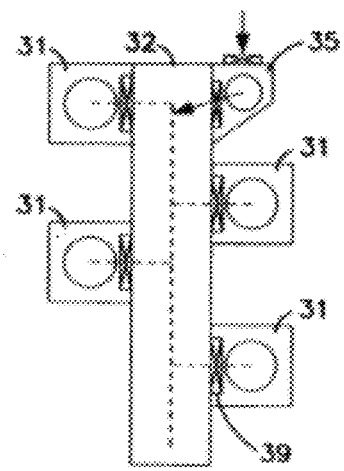
FIGS. 11A and 11B are schematic illustrations of two different embodiments of this invention.
Figure 11B:
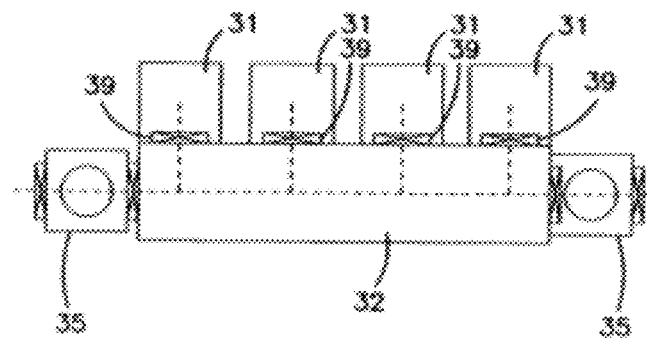

Other variations are readily possible and easily conceived. For example, instead of lining up the processing chambers as shown in FIGS. 9 and 10, processing chambers could be positioned one set above another or one set following another. If aligned with one set following another, the sets can be lined up so that the second set continues in line following the first set or alternatively the second set can be set at some form of angle to the first set. Since a transport chamber can feed wafers to each side of the chamber, two sets of processors can be set around a single transport chamber and fed by the same transport chamber (see FIG. 11A where numbers designate the same items as were discussed in connection with earlier figures. It is noted that added to FIGS. 11A and 11B is a showing of the valve 39 that separates the processing chambers 31 from the transport chambers 32 as has been discussed above.) If the second set of processors is a continuation of the first set there can sometimes be benefits to positioning additional load locks along the system. It is of course possible to add an EFEM at the far end and position a load lock before the EFEM so that the wafer can travel in a straight line entering at one end and leaving at the other (see FIG. 11B, where again numbers designate the same item as in earlier figures). In this latter case, the wafer can be programmed to enter or leave at either or both end(s). It is also possible to position processing chambers along the transfer chamber at irregular intervals or with spacing between the processing chambers. In this arrangement the key feature will be the positioning of the transfer chamber so that it can feed wafers to the individual processing chambers as desired and as directed by the computer controls for the system.

It is known in the prior art to have tandem processing chambers, wherein each chamber is configured for processing two wafers side-by-side. However, these prior art systems utilize mainframe and robot that are configured to always load two wafers that are at a set distance from each other. That is, the two arms of the prior art tandem loading robot cannot be controlled individually, and are set at a fixed distance from each other. Consequently, the mainframe, loadlock, and chamber configurations are limited to accommodate two wafers separated by this same distance. Additionally, care must be taken to make sure everything in the system, i.e., loadlock, robot arms, chucks in the chambers, etc., are adjusted to be at exactly the same separating distance. This places a tremendous limitations and burden on the system design, operation, and maintenance.

Figure 12:
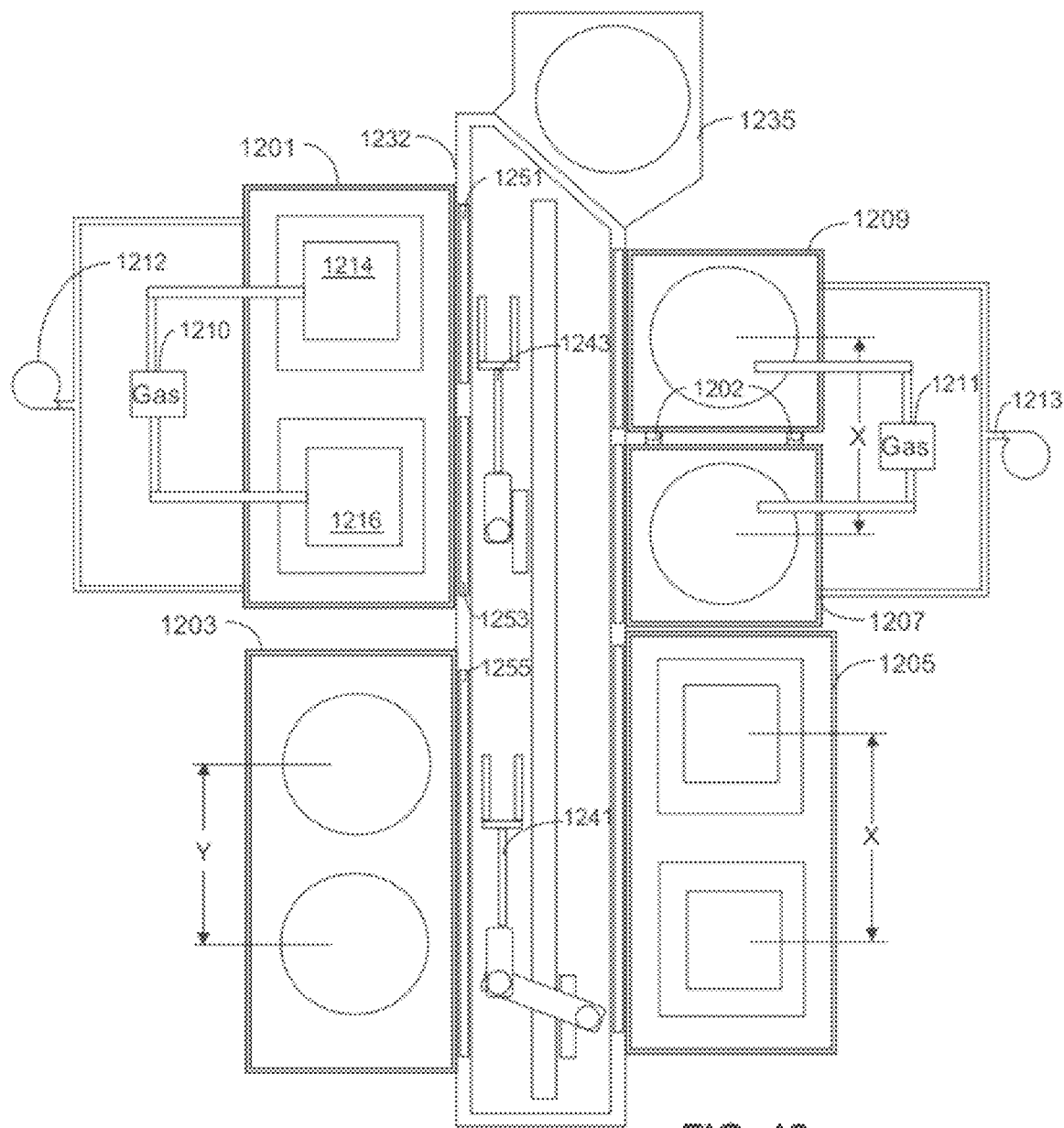
FIG. 12 illustrates an example of the innovative mainframe system as applied to tandem-type process chambers.

The innovative mainframe system may be easily configured to accommodate tandem chambers with increased freedom of design and reduced requirements for adjustments and maintenance. FIG. 12 illustrates an example of the innovative mainframe system as applied to tandem-type process chambers. The mainframe comprises the linear transport chamber 1232, having robot arms 12, 41 and 1243 that move independently of each other, and a single-stack loadlock chamber 1235. To illustrate the versatility of this innovative mainframe, in this example a single-stack, i.e., non-tandem, loadlock chamber 1235 is shown. Notably, unlike the prior art where a mainframe designed for tandem chambers must have a tandem loadlock, here, since the robot arms are independently operated, they can load wafers from a single-stack loadlock onto the tandem processing chambers. For example, two wafers may be placed one over the other inside the loadlock 1235, so that one arm takes the lower wafer and the other the upper wafer. Then each arm places its wafer in one side of the tandem chamber. According to the innovative features of this example, each robot may place a substrate on any side of the tandem processing chamber. That is, unlike the prior art wherein there's a one-to-one correspondence between the robot arm and the chambers, i.e., right robot arm can load only the right side of the tandem chamber, here any arm may load any side of the tandem chamber.

In the example of FIG. 12, five chambers, 1201, 1203, 1205, 1207 and 1209 are mounted onto the transport chamber 1232. Each of chambers 1201, 1203, 1205, forms a tandem chamber configured for processing two substrates simultaneously. Chambers 1201 and 1205 are shown with the top cover on, while chamber 1203 is shown with the top cover removed. One advantage of the innovative mainframe is that the pitch, i.e., the center-to-center distance, for each tandem processing chamber need not match to the others. For example, the pitch in chamber 1205 shown as distance X need not be the same as the pitch in chamber 1203 shown as distance Y. Rather, each robot can be trained to know the center of each processing region of each chamber mounted onto the mainframe, so that each robot arm may deliver a wafer to any processing region and place it exactly in the center. Additionally, while in prior art systems a single valve must be provided for the tandem chamber and the loadlock, here, since the robot arms are independent, each process zone may have its own independent isolation valve, as shown by 1251 and 1253 for chamber 1201, or a single valve may be used, as shown by 1255 for chamber 1203.

One advantage of using a tandem chamber is the ability to share resources between each two tandem processing zones. For example, the two processing zones of chamber 1201 share process gas source 1210 and vacuum pump 1212. That is, while each processing zone has its own gas dispensing mechanism 1214, 1216, e.g., a showerhead and related elements, the gas dispensing mechanisms of the two processing zones are coupled to the same gas source 1210, e.g., gas stick. The vacuum pump 1212 can be connected to an exhaust manifold that leads to both processing zones, thereby maintaining both zones at the same pressure. Other elements, e.g., RF source may also be common to both processing zones, or be provided separately to each zone.

Chambers 1207 and 1209 together form a hybrid single-tandem processing chambers. That is, each of chambers 1207 and 1209 is configured for processing a single wafer. However, some features of tandem processing chambers are implemented in this embodiment. For example, process gas supply 1211 and vacuum pumping 1213 may be common to both chambers. Source and bias energy may be supplied from the same or separate power sources. Optionally, keys 1202 are provided so that the two chambers are aligned while mounted onto the mainframe and function as a regular tandem chamber, but without the complexity and costs of fabricating the larger tandem processing chamber.

Figure 13:
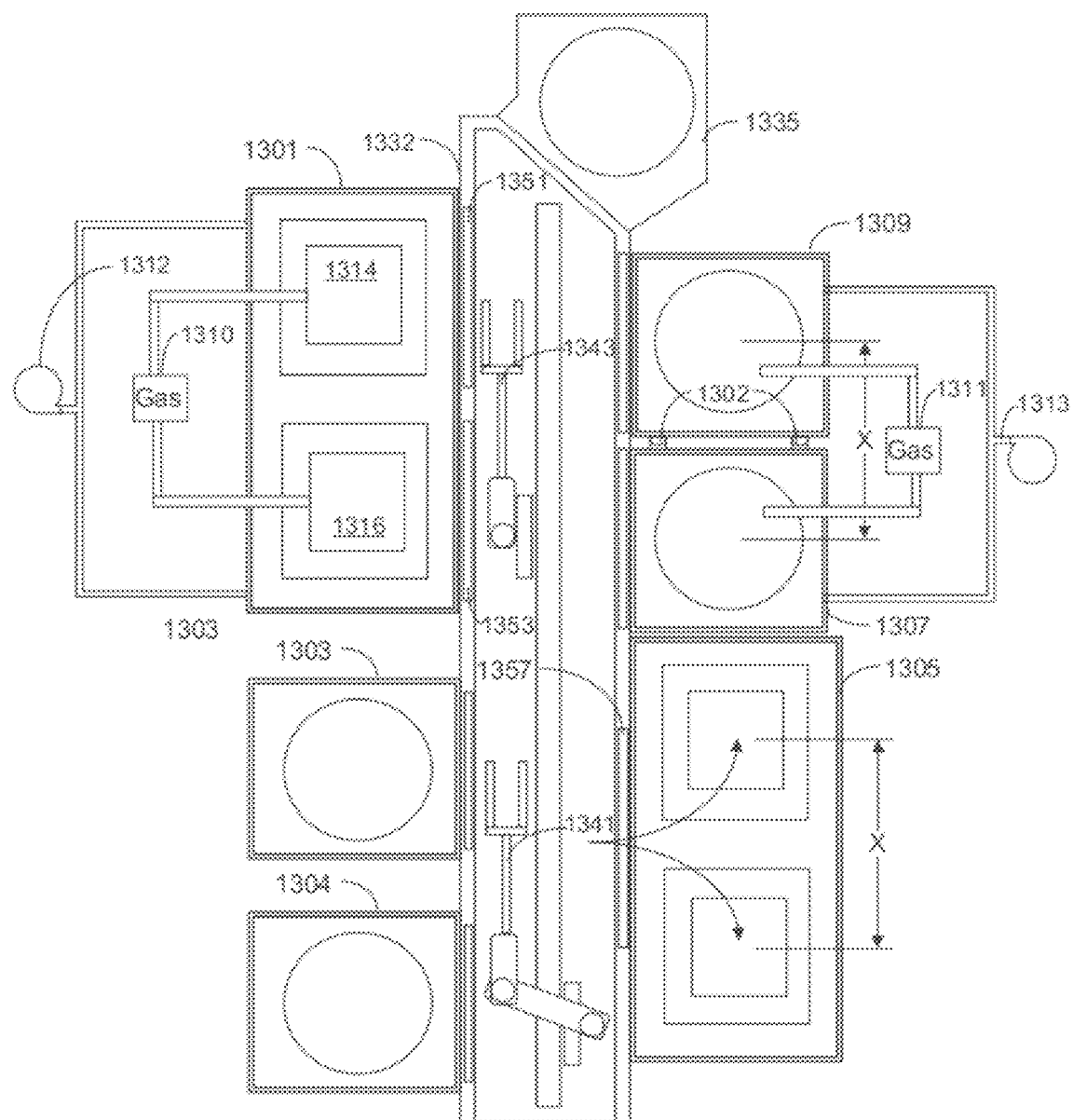
FIG. 13 illustrates yet another example of the innovative mainframe having combinations of different processing chambers.

FIG. 13 illustrates yet another example of the innovative mainframe having two tandem chambers 1301 and 1305, two independent single-wafer chambers 1303 and 1304, and one hybrid single-tandem chamber comprising chambers 1307 and 1309. That is, since using the innovative mainframe 1332 wherein the robots 1341 and 1343 are independent obviate the need to ensure that the pitch is the same for all chambers, here one may mix tandem chambers having the same or different pitch, and single-wafer chambers. Since robots 1341 and 1343 can pass over each other, they can load each of the tandem chambers simultaneously. Also, they can load each of the single-wafer chambers independently or concurrently, thus having the throughput of a tandem chamber arrangement without the need to utilize complex tandem chamber.

Another feature illustrated in FIG. 13 is the use of a single central isolation valve 1357, for loading a tandem chamber 1305. As can be seen, the valve 1357 is sized to allow passage of only a single wafer. However, two wafers are loaded into the tandem chamber 1305 as shown by the curved arrows. This cannot be done in the prior art systems.

Figure 14:
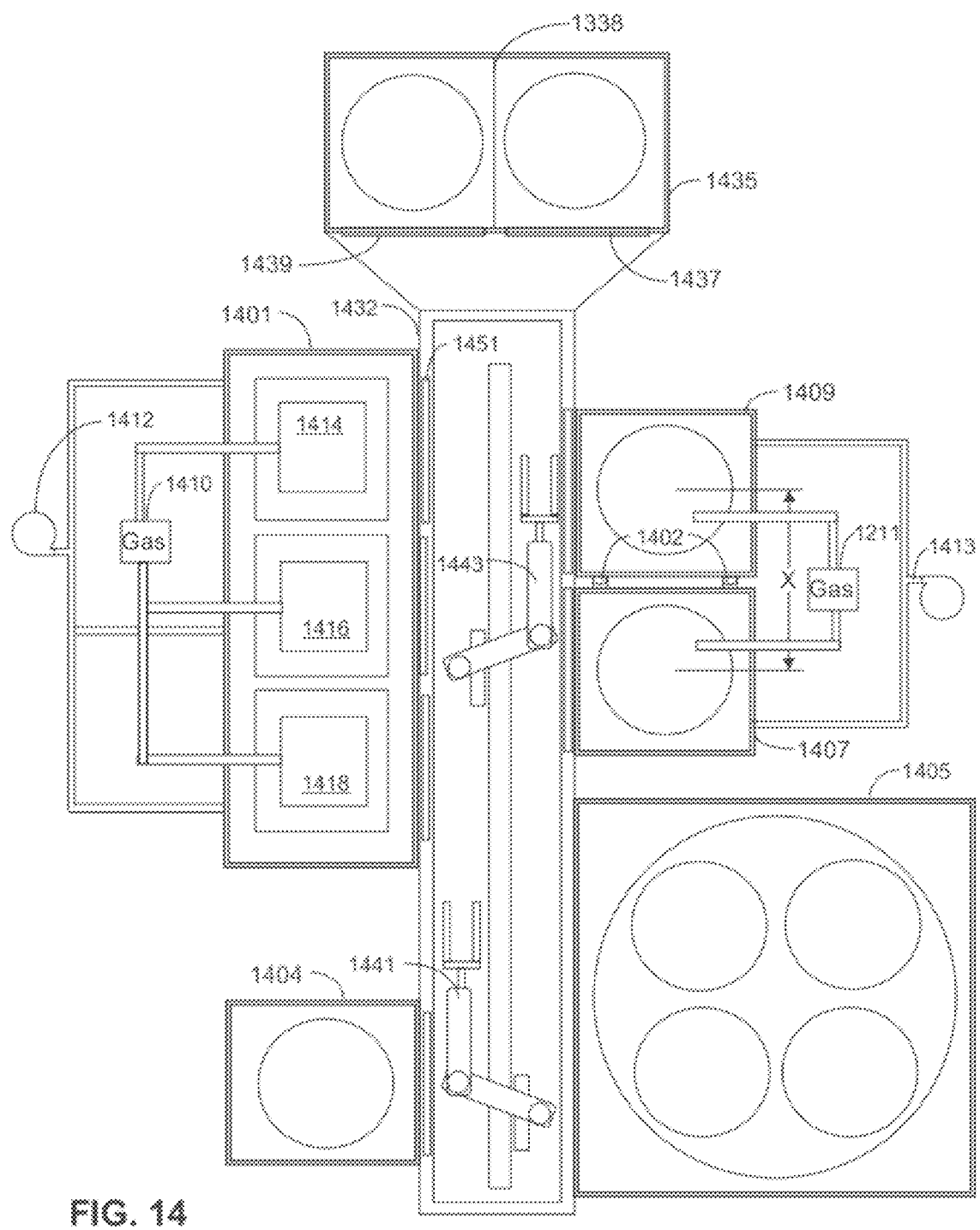
FIG. 14 illustrates another example, where different types of processing chambers are attached to the linear transport chamber.
Figure 15:
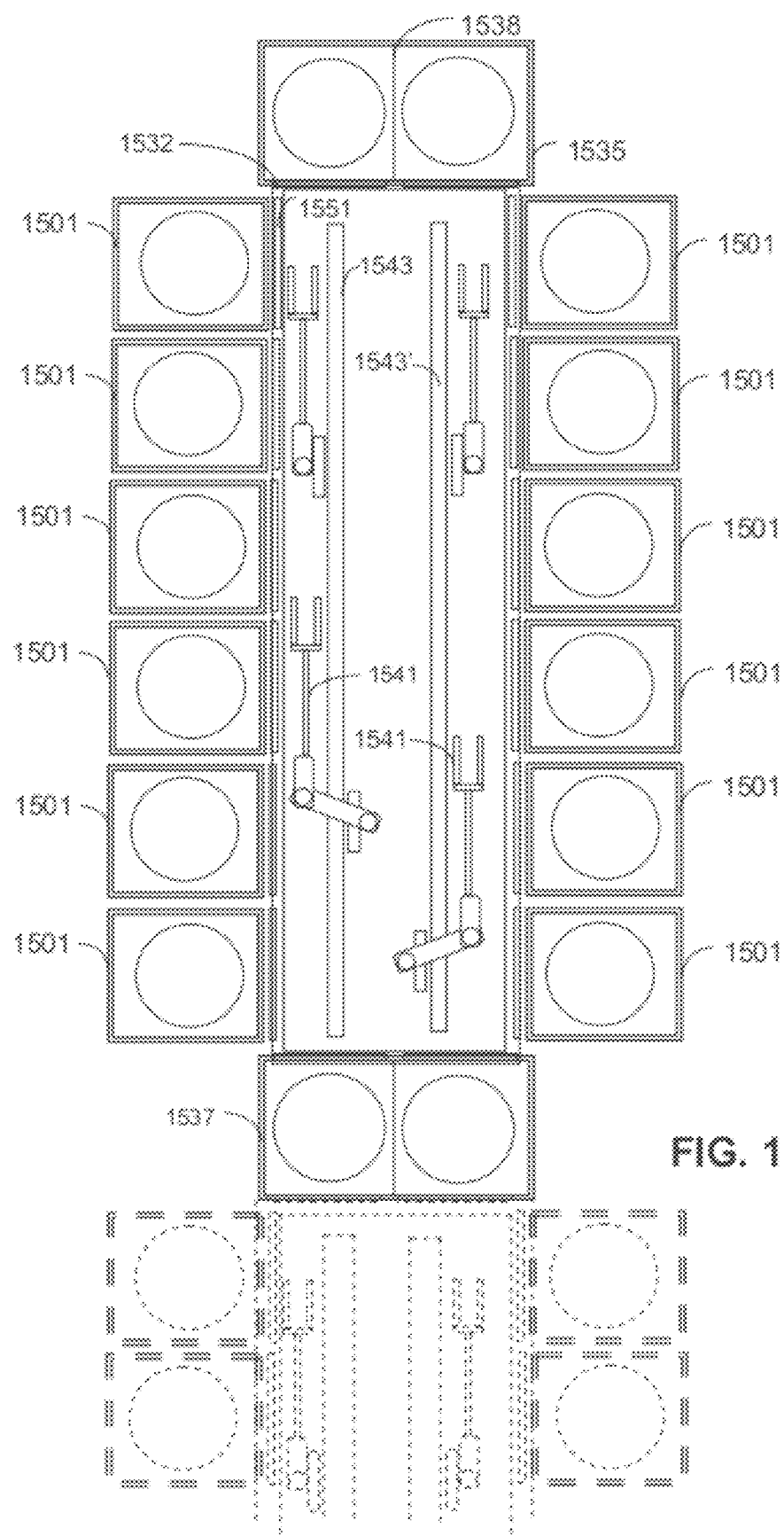
FIG. 15 illustrates another example, wherein the innovative mainframe is utilized for high throughput processing of substrates.

FIG. 14 illustrates another example, where different types of processing chambers are attached to the linear transport chamber 1432. In this example, a multiple-wafer processing chamber 1405, a triple-tandem chamber 1401, a single chamber 1404, and a hybrid single-tandem chambers 1407 and 1409 are attached to the innovative mainframe. Chamber 1405 may be a conventional-batch processing chamber, e.g., a thermal or plasma enhanced CVD chamber, having four wafer stations, i.e., four circularly-arranged processing regions defined therein. The stations may be loaded one or two at a time. Single chamber 1404 may be a single substrate processing chamber or a stacked-multiple wafers cooling station. For example, it may be a multiple, e.g., 25, wafer stacked cooling station. Further, since in this invention the robot arms are independent, tandem processing is not limited to two wafers at a time. In this example a triple-substrate tandem processing chamber is shown, enabling concurrent processing of three wafers. While here only two arms are shown, requiring a second trip of one arm for completely loading chamber 1401, an arrangement having more than two arms may be used, as illustrated in FIG. 15. Another optional feature illustrate in FIG. 14 is the use of frog-leg, generally referred to as SCARA (Selective Compliance Assembly Robot Arm), robot arms 1441 and 1443, which ride on the linear rail as in the other embodiments of the invention.

The embodiment of FIG. 14 also utilizes a tandem-stack loadlock chamber 1435, i.e., having two stacks of wafers side by side. While loadlock 1435 may be a conventional tandem loadlock, the innovative mainframe enables loadlock with features not available previously. For example, while the loadlock is tandem, it may be formed of two separate chambers, having partition 1438. Then, two isolation gates 1437 and 1439 may be provided, one for each of the tandem wafers. Using such an arrangement, unlike the prior art where only a single gate may be used so that both sides of the tandem loadloak are opened together, here each side may be opened or closed independently of the other. In this way, if the robots load two wafers simultaneously, both isolation valves may be opened. However, if a single wafer is loaded, only a single isolation gate needs to be opened.

FIG. 15 illustrates another example, wherein the innovative mainframe is utilized for high throughput processing of substrates. This arrangement is beneficial for repeated substrate processing at high throughput, such as, for example, processing of substrates for fabrication of solar cells. In this example two linear rail 1543 and 1543' are situated inside transport chamber 1532, each of which supports two linear robot arms 1541. In one example the robot arm on linear track 1543 serve the processing chambers 1501 on the left side of the transport chamber 1532, while the other robot arms serve the chambers on the other side. However, the robot arms can be constructed to serve chambers on either side of the transport chamber 1532.

Another optional feature of the example of FIG. 15 is the provision of two loadlocks. Loadlock 1535 is used to load substrates for processing, while loadlock 1537 is used for unloading substrates after completion of processing. While in this example tandem loadlocks are illustrated, it should be appreciated that a single substrate or stack loadlock may be utilized as well. By having an unloading loadlock at the opposing side to the loading loadlock, if needed another system may be coupled directly to the unloading loadlock, as shown by the broken line silhouette. In this manner the system may be made modular to accommodate various number of processing chambers as required by the particular situation.

Figure 16:
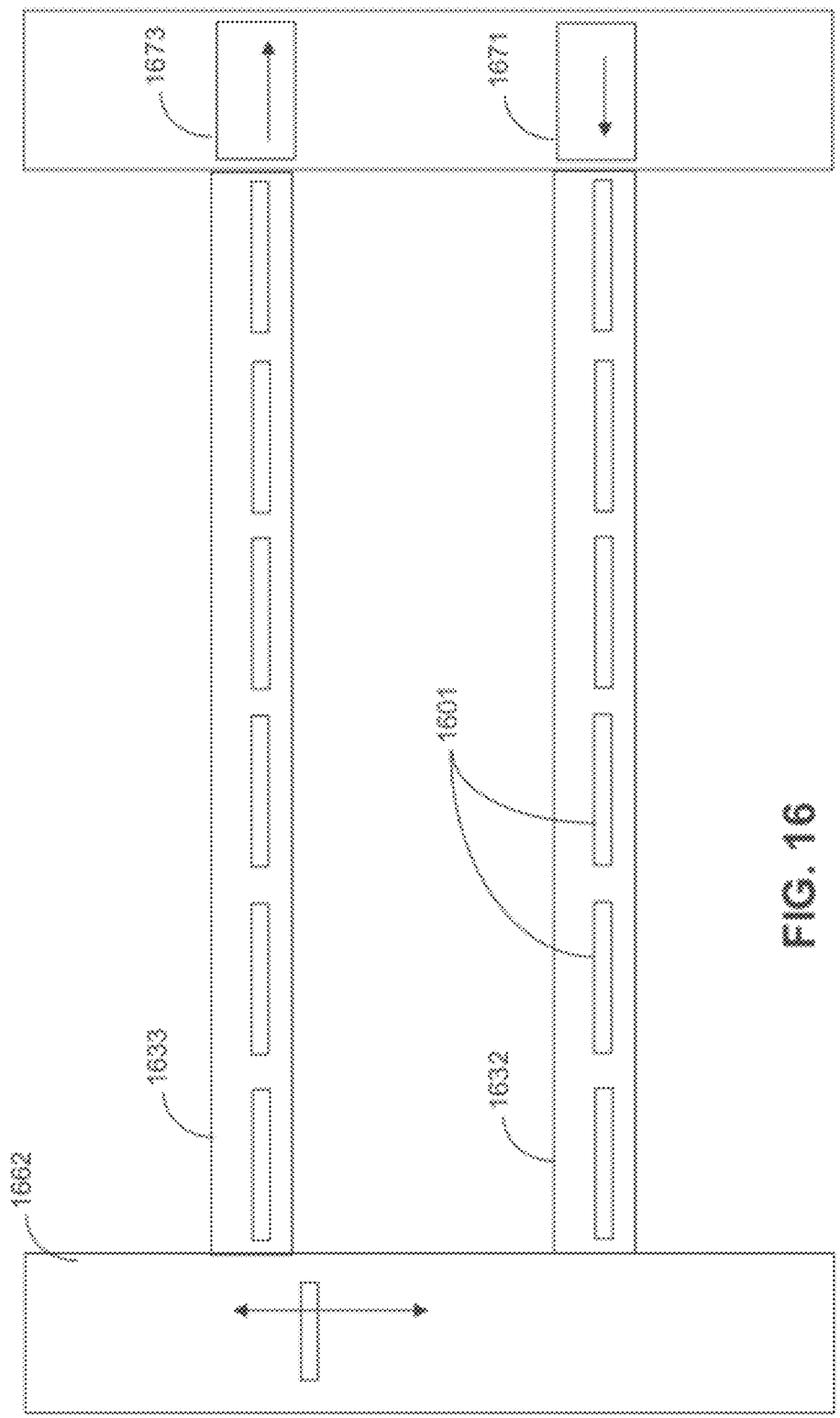
FIG. 16 illustrates an embodiment wherein two linear transport systems are vertically stacked one above the other.

According to another embodiment of the invention, the innovative mainframe is stacked. As shown in FIG. 16, an upper linear transport chamber 1633 is situated above lower linear transport chamber 1632. Each linear transport chamber has a plurality of openings 1601 with appropriate mounting arrangement for connecting processing chambers. An elevator 1662 moves substrates between the lower and upper linear transport chambers. In this particular example, substrates are loaded from load chamber 1671 and removed via unload chamber 1673; however, if desired, another elevator may be provided at the front of the system as well, so that chambers are loaded and unloaded at the same level.

Figure 17:
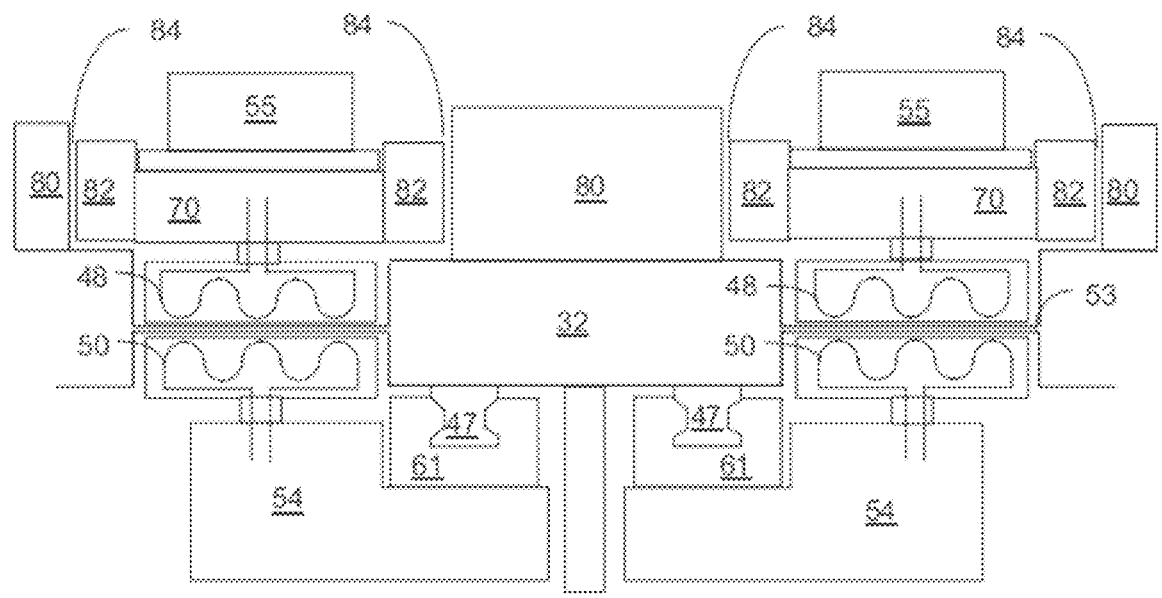
FIG. 17 illustrates an example of the innovative mainframe system wherein induced current is used to provide motive power to the robot arms.

FIG. 17 illustrates an example of the innovative mainframe system wherein induced current is used to provide motive power to the robot arms. This example is similar to that shown in FIG. 7D, with one main difference. Specifically, in the previous embodiments magnetic forces were used to impart linear and rotational motion to the robot arm; however, in this embodiment induced current is used to supply the motive power. For example, the robot arm assembly may include stepper motors for rotation, linear or both rotation and linear motion. In this embodiment, in order to avoid having any electrical wiring in the evacuated portion of the transport chamber, the stepper motors are energized using induced current. Each of the stepper motors is coupled to conductive coils, e.g., coils 48, situated inside the vacuum environment. A driving coil 50 is situated outside the vacuum environment in a position opposing the coil 48. When a stepper motor needs to be energized, current is flowed in the proper coil 50, which induces current in the corresponding coil 48, to thereby energize the motor.

Figure 18A:
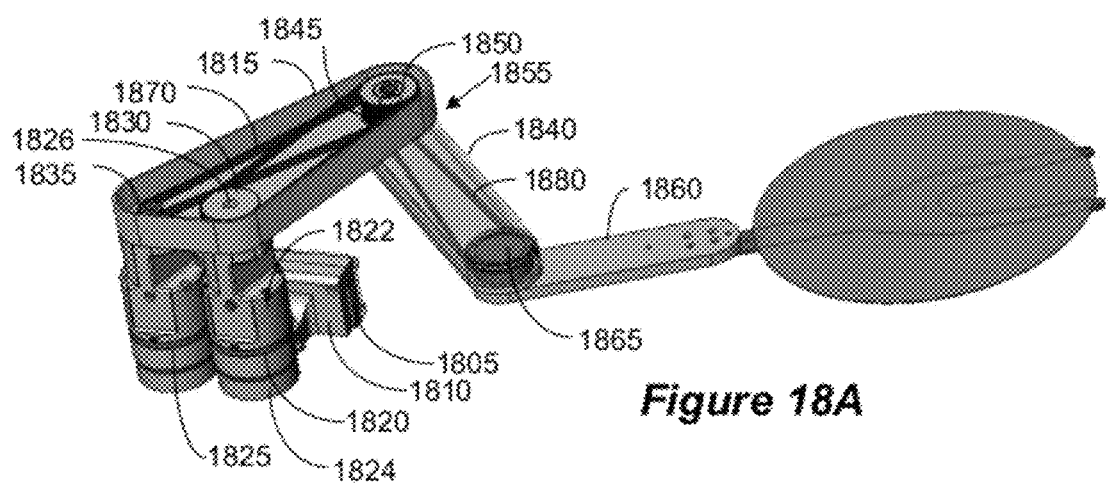
FIGS. 18A-C illustrate an articulated arm robot according to an embodiment of the invention.
Figure 18B:
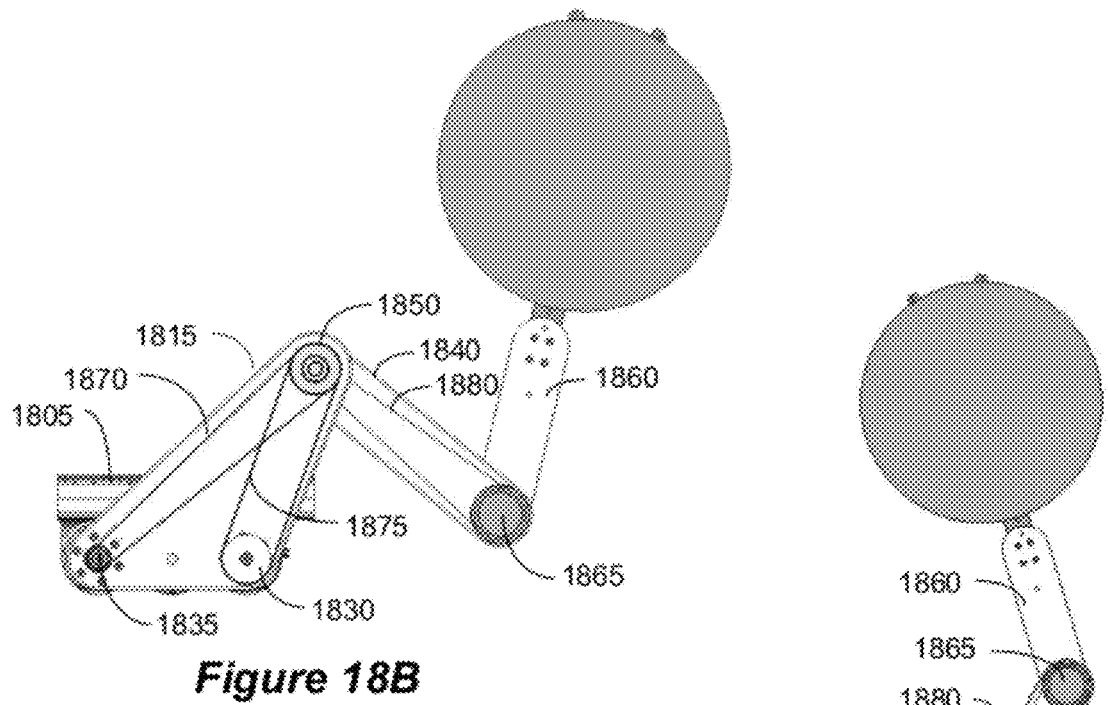
Figure 18C:
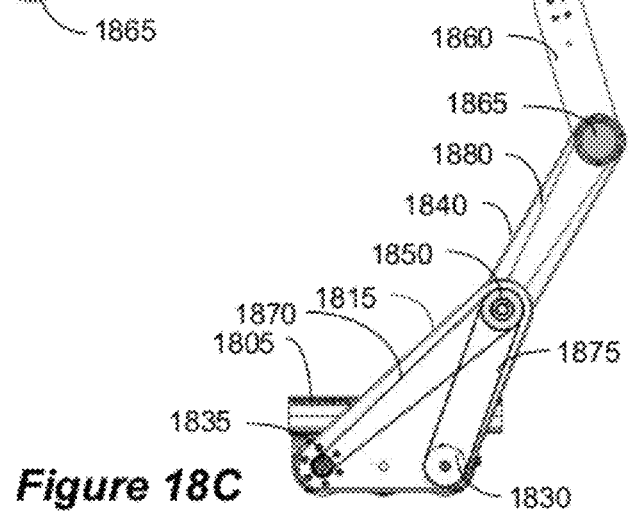

FIGS. 18A-C illustrate an articulated arm robot according to an embodiment of the invention. The robot arm shown in FIGS. 18A-C has a first arm section that is affixed to a base, a second arm section rotatably coupled to the first arm section, and a third arm section rotatably coupled to the second arm section. In FIGS. 18A-C a base 1810 freely rides on linear track 1805. The base's linear motive force may be provided by a linear motor, as explained with respect to the other embodiments in this disclosure. A first arm section 1815 is affixed to the base 1810, such that the first arm section 1815 does not rotate. Also affixed to the base are two magnetically-coupled followers assemblies 1820 and 1825. These may be structured similar to any of the magnetically-coupled followers assemblies disclosed above. Note that in this particular example the first arm section 1815 is affixed to the base 1810 via the magnetically-coupled followers assemblies 1820 and 1825, however other means of affixing the first arm section 1815 to the base 1810 may be used.

Magnetically-coupled followers assembly 1820 is made of a housing 1822, which may house reducing gears as explained above. The reducing gears may be such as shown in, for example, the embodiments of FIGS. 7 and 7A. A rotating magnetically-coupled follower 1824 extends from the bottom of the housing 1822. A rotating shaft 1826 extends from the top of the housing 1822. Magnetically-coupled followers assembly 1825 is constructed similarly.

Magnetically-coupled followers assembly 1820 is coupled to pulley 1830, while magnetically-coupled followers assembly 1825 is coupled to pulley 1835, i.e., the pulleys are attached to the rotating shafts that extend from the top of the Magnetically-coupled followers assembly housings, such as shaft 1826. Second arm section 1840 is rotatably coupled to the end of the first arm section 1815. The second arm section 1840 is rotatable via pulley 1845, which, in this example, is provided below pulley 1850. This may be done using, e.g., nested shafts, wherein pulley 1845 is coupled to an outer shaft that imparts rotation motion to the second arm section 1840, while pulley 1850 is coupled to inner shaft, nested within an outer shaft, and rotates freely of the second arm section 1840 rotation. Pulley 1850 imparts rotational motion to pulley 1855, which is provided within the second arm section 1840, but which is obscured from view by the first arm section 1815. That is, pulleys 1850 and 1855 may be attached to a common shaft. A third arm section 1860 is rotatably coupled to the end of the second arm section 1840. Rotation is imparted to the third arm section via pulley 1865.

In operation, the robot arm assembly moves linearly using the linear drive, as described above. A first rotation motor (not shown) is positioned in atmosphere below the robot arm assembly and imparts rotation motion to the magnetically-coupled follower assembly 1825, which rotates pulley 1835. An endless flexible band 1870, such as a belt, cord, chain, etc., transfers the rotation from pulley 1835 to pulley 1845, to thereby rotate the second arm section 1840. In this embodiment, pulleys 1835 and 1845 have a reduction ratio, i.e., pulley 1835 has a smaller diameter than pulley 1845, such that pulley 1835 rotates faster than pulley 1845, to thereby reduce the rotation speed of the second arm section 1840.

Another rotational motor (not shown) impart rotation motion to the magnetically-coupled follower assembly 1820, which rotates pulley 1830. An endless flexible band 1875, such as a belt, cord, chain, etc., transfers the rotation from pulley 1830 to pulley 1850. The rotation of pulley 1850 is transferred to pulley 1855 via a shaft. Another endless flexible band 1880 then transfers the rotation of pulley 1855 to pulley 1865, to thereby rotate arm section 1860. In this embodiment, pulleys 1830 and 1850 are of the same diameter, thereby having no reduction ratio, such that pulleys 1830 and 1850 rotate at the same speed. On the other hand, pulley 1855 has a smaller diameter than pulley 1850 and pulley 1865. Consequently, pulleys 1855 and 1865 have a reduction ratio, such that pulley 1855 rotates faster than pulley 1865, to thereby reduce the rotation speed of the second arm section 1860.

Figure 19A:
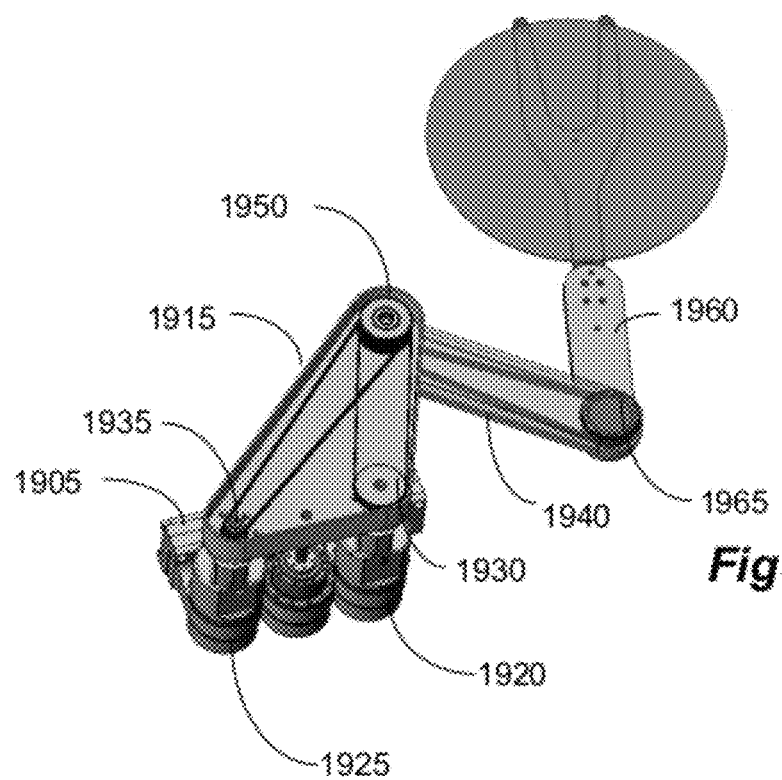
FIGS. 19A and 19B illustrate a four-axis robot arm, according to an embodiment of the invention.
Figure 19B:
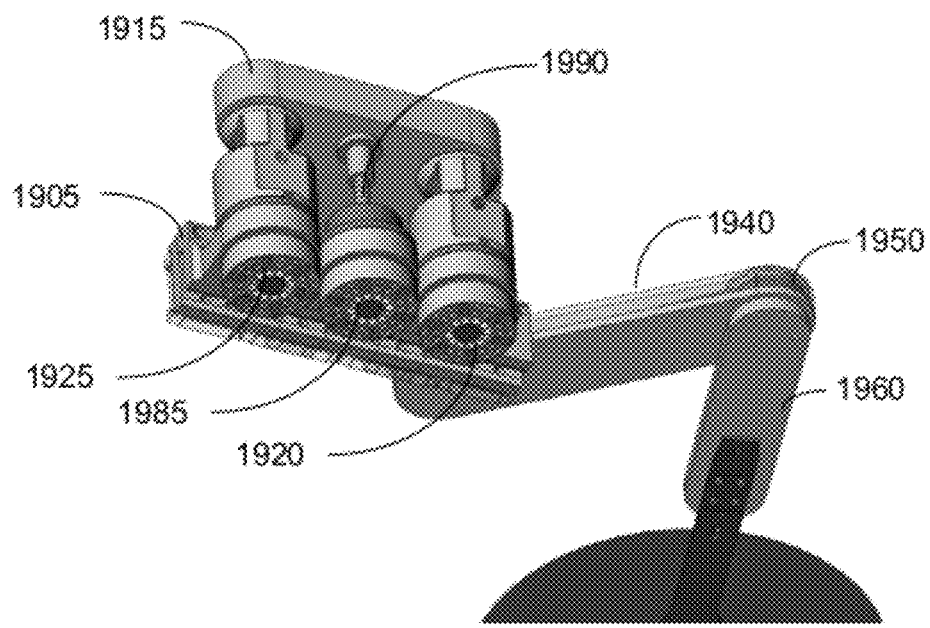

FIGS. 19A and 19B illustrate a four-axis robot arm according to an embodiment of the invention, which can be implemented in any of the embodiments disclosed herein. The embodiment of FIGS. 19A and 19B illustrate a z-motion mechanism that may be implemented in any of the embodiments disclosed above. However, to illustrate how all of the various features disclosed herein can be combined, the embodiment of FIGS. 19A and 19B includes the linear motion, the rotation and articulation of the arm, and a z-motion mechanism applied to the arm. On the other hand, elements such as covers and z-motion bearings are not shown, so as not to obscure important parts of this embodiment.

The embodiment of FIGS. 19A and 19B has a fixed arm 1915, similar to that shown in the embodiments of FIGS. 18A-C. Also, magnetically-coupled followers assemblies 1920 and 1925 are rotated via motors positioned outside of the vacuum chamber, so as to provide the rotation of the arm sections 1940 and 1960. The magnetically-coupled followers 1920 and 1925 are attached to a base that rides freely on tracks 1905 and is motorized by a linear motor (not shown) as in other embodiments shown herein. Of course, the robot arm may have only a fixed arm section or a single rotating section, as shown in, e.g., the embodiment of FIGS. 5 and 6, but includes the z-motion as described below.

To provide z-motion, a third magnetically-coupled follower assembly 1985 is provided. Magnetically-coupled follower assembly 1985 is rotated via rotational motor (not shown) that is situated outside the vacuum chamber, and may include gear reduction, as shown in other embodiments herein, so as to reduce the rotational speed imparted by the rotational motor. The magnetically-coupled follower transfers the rotational motion, optionally via reduction gears, to lead screw 1990. Lead screw 1990 then raises or lowers the fixed arm 1915, depending on the rotation direction. In this manner, z-motion is imparted to the articulated robot arm. In this embodiment, drive pulleys 1930 and 1935 are mounted on spline shaft or other mechanism that allows the drive pulleys to move up and down relative to the base assembly. Also, while not shown, in this embodiment bellows are used to cover the lead screw assembly so as to avoid particles in the vacuum chamber.

Although the chambers have been described as under vacuum conditions, in fact in some instances there can be benefits to including certain gases or other fluids in the contained areas. Accordingly the term vacuum as used herein should also be interpreted as a self contained environment as to encompass special gases for example that may be employed in the total system.

In FIG. 1, the cluster tool includes 7 processing chambers. In FIG. 9 the disclosed system includes 8 processing chambers. The total footprint of the tool in FIG. 1 with peripherals is approximately 38 m². The total footprint of the tool in FIG. 9 (with an additional processing chamber and peripherals) is 23 m². Thus the footprint for a system with more chambers is considerably less if a linear arrangement in accordance with this invention is employed. In large measure this improvement is achieved through the use of an improved feed system illustrated as transport chamber 32 in FIG. 9 as compared to the use of central sections as is done with the system of the type shown in FIG. 1.

The linear architecture of the present invention is extremely flexible and lends itself to multiple substrate sizes and shapes. Wafers used into the fabrication of semiconductors are typically round and about 200 or 300 mm in diameter. The semiconductor industry is always trying to get more devices per wafer and has steadily moved to larger and larger wafer sizes from 75 mm, 100 mm, 200 mm to 300 mm and there is an on going effort to look at moving to 450 mm diameter wafers. Due to the unique architecture the floor space required in the clean room wafer fab would not grow as large as it would with a typical cluster tool with the processes located on the circumference.

Further if it is desired to increase the size of the cluster tool type (FIG. 1) to increase output, the add on to the total measurements is to a raised power; whereas, an increase in size of the system described in this application is in a single direction, i.e., length, with the width of the system staying the same. In similar processes, such as an aluminum process, throughput for the same period of time using the system of the type illustrated in FIG. 9, which occupies less space than the equipment shown in FIG. 1, the equipment of FIG. 9 produces almost twice as many wafers (in quick calculations about 170%) as does a system like that of FIG. 1. Thus there is a considerable improvement in wafer output per a measured clean room area using the system disclosed as compared to prior art units. Obviously this achieves an objective of reducing costs in the manufacture of wafers.

The design of this equipment is not limited to circular substrates. A cluster tool that moves wafers in paths described by arcs is particularly disadvantaged if the substrates are rectangular as the tool would need to be sized to handle a circular substrate that inscribes the rectangular shape of the actual substrate; whereas, the linear tool need be no larger in any direction than what is required to pass the actual shape. For example, working with a 300 mm square substrate, a cluster tool would need to be sized to handle a 424 mm circular substrate while the linear tool need be no larger than that required for a 300 mm circular substrate.

Also the size of the transport chamber 32 need provide only that room required to move the substrate whether a wafer of some other member, along from the entrance chamber through and into processing chambers and from processing chambers out of the system. Thus the width of this chamber should be slightly larger than the size of the substrate to be processed. However, smaller members may be processed in the system, and may be processed together as a plurality in a substrate holder.

While this invention has been discussed in terms of exemplary embodiments of specific materials, and specific steps, it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. A substrate transfer system, comprising:
an elongated vacuum chamber;
a linear track affixed inside the elongated vacuum chamber;
a first motor positioned outside the vacuum chamber and rotating a first magnetic driver;
a second motor positioned outside the vacuum chamber and rotating a second magnetic driver;
a robot arm assembly riding on the linear track and comprising:
a base configured for free riding on the linear track;
a linear motor imparting linear motion to the base;

a fixed arm coupled to the base;
an articulated arm rotatably coupled to the fixed arm;
a first magnetically-coupled follower assembly configured to magnetically follow rotation of the first magnetic driver to thereby rotate the articulated arm; and
a second magnetically-coupled follower assembly configured to magnetically follow rotation of the second magnetic driver; and,
an elevation mechanism coupled to and receiving rotational motion from the second magnetically-coupled follower assembly to thereby elevate the fixed arm;
wherein the first and second magnetically-coupled followers are configured to follow linear movement of a respective one of the first and second magnetic drivers to thereby drive the robot arm along the linear track.

2. The substrate transfer system in accordance with claim 1, further comprising:
a first pulley coupled to the first magnetically-coupled follower assembly;
a second pulley coupled to the articulated arm; and,
a flexible endless band transferring rotational motion from the first pulley to the second pulley to thereby rotate the articulated arm.

3. The substrate transfer system in accordance with claim 1, wherein the elevation mechanism comprises a lead screw.

4. The substrate transfer system in accordance with claim 2, further comprising a spline shaft and wherein the first pulley is mounted onto the spline shaft.

5. The substrate transfer system in accordance with claim 1, further comprising:
a robot arm section rotatably coupled to the articulated arm.

6. The substrate transfer system in accordance with claim 5, further comprising:
a third motor positioned outside the vacuum chamber and rotating a third magnetic driver;
a third magnetically-coupled follower assembly configured to magnetically follow rotation of the third magnetic driver to thereby rotate the robot arm section.

7. The substrate transfer system in accordance with claim 6, further comprising a pulley and endless band assembly transferring rotational motion of the third motor to rotate the robot arm section.

8. The substrate transfer system in accordance with claim 7, further comprising a spline shaft and wherein at least one pulley of the pulley and endless band assembly is mounted onto the spline shaft.

9. The substrate transfer system in accordance with claim 1, further comprising a vacuum partition between the first and second magnetic drivers and the first and second magnetic follower assemblies.

10. The substrate transfer system in accordance with claim 1, wherein the first magnetic follower assembly further comprises reducing gears.

11. The substrate transfer system in accordance with claim 10, wherein the second magnetic follower assembly further comprises reducing gears.

12. The substrate transfer system in accordance with claim 8, wherein the first magnetic follower assembly further comprises reducing gears.

13. The substrate transfer system in accordance with claim 12, wherein the second magnetic follower assembly further comprises reducing gears.

14. The substrate transfer system in accordance with claim 13, wherein the third magnetic follower assembly further comprises reducing gears.

15. A substrate transfer system, comprising:
an elongated vacuum chamber;
a linear track affixed inside the elongated vacuum chamber;
a first motor positioned outside the vacuum chamber and rotating a first magnetic driver;
a second motor positioned outside the vacuum chamber and rotating a second magnetic driver;
a robot arm assembly riding on the linear track and comprising:
a base configured for free riding on the linear track;
a linear motor imparting linear motion to the base;
a fixed arm coupled to the base with a rigid coupling so that the fixed arm does not rotate;
an articulated arm rotatably coupled to the fixed arm;
an extension articulated arm rotatably coupled to the articulated arm;
a first magnetically-coupled follower assembly configured to magnetically follow rotation of the first magnetic driver to thereby rotate the articulated arm; and
a second magnetically-coupled follower assembly configured to magnetically follow rotation of the second magnetic driver to thereby rotate the extension articulated arm.

16. The substrate transfer system of claim 15, further comprising a first pulley and endless band assembly transferring rotational motion form the first magnetically-coupled follower assembly to thereby rotate the articulated arm and a second pulley and endless band assembly transferring rotational motion form the second magnetically-coupled follower assembly to thereby rotate the extension articulated arm.

17. The substrate transfer system of claim 15, further comprising:
a third motor positioned outside the vacuum chamber and rotating a third magnetic driver;
a third magnetically-coupled follower assembly configured to magnetically follow rotation of the third magnetic driver; and,
an elevation mechanism coupled to and receiving rotational motion from the third magnetically-coupled follower assembly to thereby elevate the fixed arm.

18. The substrate transfer system of claim 17, wherein the elevation mechanism comprises a lead screw.

19. The substrate transfer system of claim 17, wherein the first pulley and endless band assembly further comprises a spline shaft and a first pulley mounted onto the spline shaft.

20. The substrate transfer system of claim 17, wherein at least one of the first, second and third magnetic follower assemblies comprises reducing gears.

* * * * *